United States Patent
Kaise et al.

(10) Patent No.: US 8,475,623 B2
(45) Date of Patent: *Jul. 2, 2013

(54) SUBSTRATE PROCESSING METHOD, SYSTEM AND PROGRAM

(75) Inventors: Seiichi Kaise, Nirasaki (JP); Noriyuki Iwabuchi, Miyagi-gun (JP); Shigeaki Kato, Miyagi-gun (JP); Hiroshi Nakamura, Nirasaki (JP); Takeshi Yokouchi, Miyagi-gun (JP); Mariko Shibata, Miyagi-gun (JP); Akira Obi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/565,401

(22) Filed: Aug. 2, 2012

(65) Prior Publication Data

US 2012/0292290 A1 Nov. 22, 2012

Related U.S. Application Data

(63) Continuation of application No. 13/073,618, filed on Mar. 28, 2011, now Pat. No. 8,257,601, which is a continuation of application No. 11/263,033, filed on Nov. 1, 2005, now abandoned.

(60) Provisional application No. 60/635,958, filed on Dec. 15, 2004.

(30) Foreign Application Priority Data

Nov. 1, 2004 (JP) .................... 2004-318451

(51) Int. Cl.
  *C23F 1/00* (2006.01)
(52) U.S. Cl.
  USPC ............ 156/345.24; 156/345.31; 156/345.32; 156/345.51; 156/345.52; 216/55; 216/58; 216/67; 700/121

(58) Field of Classification Search
  USPC ............ 156/345.24, 345.31, 345.32, 345.51, 156/345.52
  See application file for complete search history.

(56) References Cited

U.S. PATENT DOCUMENTS

| 5,542,559 A | 8/1996 | Kawakami et al. |
| 5,636,963 A | 6/1997 | Haraguchi et al. |

(Continued)

FOREIGN PATENT DOCUMENTS

| CN | 1409156 A | 4/2003 |
| JP | 8-64655 | 3/1996 |
| JP | 10-135093 | 5/1998 |
| JP | 11-288996 | 10/1999 |

(Continued)

OTHER PUBLICATIONS

Office Action issued Jan. 19, 2012 in Japan Application No. 2004-318451 (with English translation).

(Continued)

*Primary Examiner* — Karla Moore
(74) *Attorney, Agent, or Firm* — Oblon, Spivak, McClelland, Maier & Neustadt, L.L.P.

(57) ABSTRACT

A substrate processing method is used for a substrate processing system having a substrate processing device and a substrate transfer device. The substrate processing method includes a substrate transfer step of transferring a substrate and a substrate processing step of performing a predetermined process on the substrate. The substrate transfer step and the substrate processing step include a plurality of operations, and at least two operations among the plurality of the operations are performed simultaneously. Preferably, the substrate processing device includes an accommodating chamber, a mounting table placed in the accommodating chamber to be mounted thereon the substrate, and a heat transfer gas supply line for supplying a heat transfer gas to a space between the substrate mounted on the mounting table and the mounting table.

2 Claims, 23 Drawing Sheets

U.S. PATENT DOCUMENTS

| | | | |
|---|---|---|---|
| 5,997,962 | A | 12/1999 | Ogasawara et al. |
| 6,143,081 | A | 11/2000 | Shinriki et al. |
| 6,231,716 | B1 | 5/2001 | White et al. |
| 6,746,239 | B2 | 6/2004 | Takahashi |
| 6,750,155 | B2 | 6/2004 | Halsey et al. |
| 6,818,560 | B1 | 11/2004 | Koshimizu et al. |
| 6,889,110 | B1 | 5/2005 | Jain et al. |
| 6,899,109 | B1 | 5/2005 | Nguyen |
| 8,257,601 | B2 * | 9/2012 | Kaise et al. ............ 216/58 |
| 2001/0014111 | A1 | 8/2001 | Shimizu |
| 2004/0194888 | A1 | 10/2004 | Ito |

FOREIGN PATENT DOCUMENTS

| | | |
|---|---|---|
| JP | 2002-141255 | 5/2002 |
| JP | 2003-100605 | 4/2003 |
| JP | 2003-347283 | 12/2003 |
| JP | 2004-303969 | 10/2004 |
| JP | 2004304123 A | 10/2004 |

OTHER PUBLICATIONS

Office Action issued on Sep. 13, 2011 in corresponding Japanese Patent Application No. 2004-318451 (with English translation).

* cited by examiner

FIG.26A
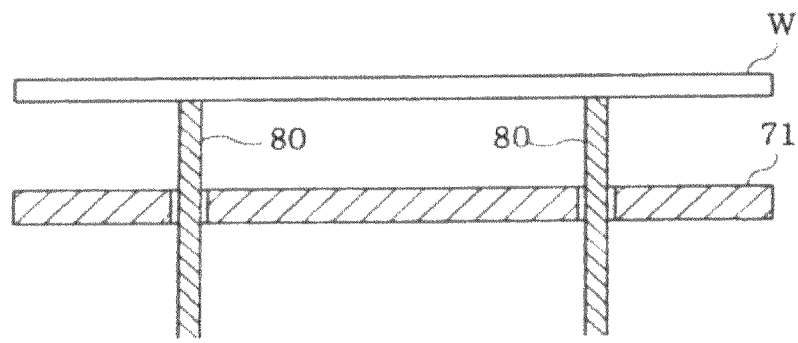
FIG.26B
FIG.26C
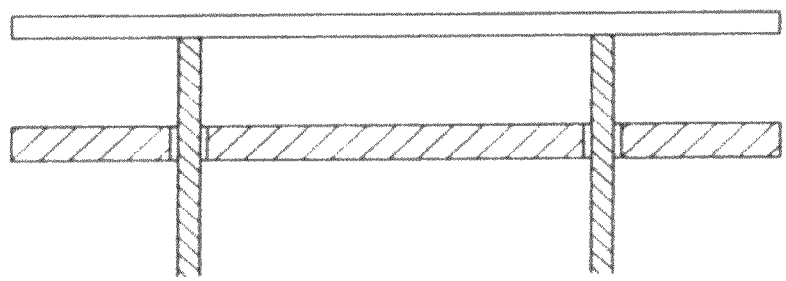

SUBSTRATE PROCESSING METHOD, SYSTEM AND PROGRAM

CROSS-REFERENCE TO RELATED APPLICATIONS

This application is a continuation application of pending U.S. application Ser. No. 13/073,618, filed Mar. 28, 2011, which is a continuation of U.S. application Ser. No. 11/263,033, filed Nov. 1, 2005, which claims priorities to Japanese Patent Application No. 2004-318451, filed Nov. 1, 2004, and U.S. Provisional Application No. 60/635,958, filed on Dec. 15, 2004, the entire contents of each of which are incorporated herein by reference.

FIELD OF THE INVENTION

The present invention relates to a substrate processing method, system and program; and, more particularly, to a substrate processing method, system and program for transferring a substrate to perform a desired process thereon.

BACKGROUND OF THE INVENTION

Conventionally, a substrate processing system for performing a film forming process, an etching process or the like on a semiconductor wafer (hereinafter, referred to as "wafer") as a substrate includes a process module (hereinafter, referred to as "PM") for receiving a wafer to perform a process thereon; an atmospheric transfer unit for taking out a wafer from a wafer cassette as a sealed chamber for storing a specified number of wafers; and a load-lock chamber located between the atmospheric transfer unit and the PM for transferring a wafer from the atmospheric transfer unit to the PM or vice versa.

In the conventional substrate processing system, process improvements of the individual devices included therein have been made in order to enhance the throughput that is calculated by wafer processing time. However, to meet the recent strong demands for a further throughput enhancement, in addition to the process improvements of the individual devices, active investigations are carried out to find methods of enhancing the efficiency by improving a coordination between the individual devices included in the substrate processing system in view of OEE (Overall Equipment Efficiency). In addition, to enhance the efficiency by improving the coordination between the individual devices, an external device for generally controlling the processes of the individual devices in the substrate processing system is also being developed.

As an apparatus for enhancing the efficiency by improving the coordination between the individual devices, there is known a throughput adjusting device used for a semiconductor manufacturing apparatus in which every process module has a gate valve that can be opened and closed by an operation of an air cylinder, wherein the semiconductor manufacturing apparatus is a single-wafer type apparatus including a plurality of process modules and a CCU (Central Control Unit) for controlling the operations of the process modules (for example, see Japanese Laid-Open Application No. H10-135093).

In this throughput adjusting device, a CPU in a CCU controls an electronic valve of an air cylinder to be closed and a timer counter T in a RAM in the CCU is operated to start to close a gate valve and at the same time to measure an actual operation time T1. Thereafter, when the gate valve is completely closed, the CPU substitutes the time measured by the timer counter T for an operation time T1, computes an idle time T2 by subtracting the operation time T1 from an operation monitoring time T0 read out from the RAM, and displays a current situation on a display in the throughput adjusting device. Thus, an operator can measure the operation time of devices easily and quickly, and the throughput of the semiconductor manufacturing apparatus can be enhanced by using the measured result and the like.

Furthermore, as a method of enhancing the efficiency by improving the coordination between the individual devices, there is known a method of determining manufacturing conditions by determining the number of surplus cassettes during the semiconductor manufacturing process, wherein a buffer size setting device computes S, i.e., the number of surplus wafers, from an OEE value calculated by using a specified formula based on the throughput of the manufacturing apparatus, the total number of the wafers, the time taken to mount and transfer the wafers, the number of the wafers kept in cassettes and the number of the cassettes, so that the number of the surplus cassettes are determined easily and precisely based on the computed S value (for example, see Japanese Laid-Open Application No. 2002-141255).

However, since the above-described device and method are to compute or predict an amount of the throughput that can be increased, they do not propose any substantial and specific techniques for enhancing the throughput. In other words, the above-described device and method propose little more than a conventional way of enhancing the throughput such as reducing idle times between individual steps during the manufacturing process based on the computed or predicted amount of the throughput that can be increased, and it is not possible to greatly enhance the throughput by using them because, while a specified device performs a specified operation, other devices not involved in the specified operation merely wait until moments for them to start their operations.

SUMMARY OF THE INVENTION

It is, therefore, an object of the present invention to provide a substrate processing method, system and program capable of greatly enhancing the throughput.

To achieve the object, in accordance with one aspect of the present invention, there is provided a substrate processing method used for a substrate processing system having a substrate processing device and a substrate transfer device, including: a substrate transfer step of transferring a substrate; and a substrate processing step of performing a predetermined process on the substrate, wherein the substrate transfer step and the substrate processing step include a plurality of operations, and at least two operations among the plurality of the operations are performed simultaneously.

Preferably, the substrate processing device includes: an accommodating chamber; a mounting table (such as a susceptor or a pedestal) placed in the accommodating chamber to be mounted thereon the substrate; and a heat transfer gas supply line for supplying a heat transfer gas to a space between the substrate mounted on the mounting table and the mounting table, wherein a vacuum pumping operation for vacuum pumping the heat transfer gas supply line and a transferring operation for transferring the substrate into the accommodating chamber are performed simultaneously.

Preferably, the substrate processing device includes: an accommodating chamber; a mounting table placed in the accommodating chamber to be mounted thereon the substrate; and elevation pins protruded from the mounting table to move up and down the substrate, wherein a pin protruding operation for protruding the elevation pins and a transferring operation for transferring the substrate into the accommodating chamber are performed simultaneously.

Preferably, in the above-described substrate processing method, a pin moving-down operation for moving down the elevation pins and a taking-out operation for taking the substrate out of the accommodating chamber are performed simultaneously.

Preferably, the substrate processing device includes: an accommodating chamber; and a pressure control unit for controlling a pressure in the accommodating chamber, wherein a taking-in operation for taking the substrate into the accommodating chamber and a pressure-up operation for increasing the pressure in the accommodating chamber by the pressure control unit are performed simultaneously.

Preferably, the substrate processing device includes: an accommodating chamber; a mounting table placed in the accommodating chamber to be mounted thereon the substrate; a heat transfer gas supply line for supplying a heat transfer gas to a space between the substrate mounted on the mounting table and the mounting table; a high frequency power supply for supply a high frequency power to the mounting table; and a gas flow rate control and supply unit for control a flow rate of a desired gas to supply the desired gas into the accommodating chamber, wherein an application stopping operation for stopping an application of the high frequency power by the high frequency power supply, a gas supply stopping operation for stopping a supply of the gas by the gas flow rate control and supply unit, and a vacuum pumping operation for vacuum pumping the heat transfer gas supply line are performed simultaneously.

Preferably, the substrate processing device includes: an accommodating chamber; a mounting table placed in the accommodating chamber to be mounted thereon the substrate; elevation pins protruded from the mounting table to move up and down the substrate; a pressure control unit for controlling a pressure in the accommodating chamber; and a gas flow rate control and supply unit for control a flow rate of a desired gas to supply the desired gas into the accommodating chamber, wherein a pin protruding operation for protruding the elevation pins, a pressure-down operation for decreasing the pressure in the accommodating chamber by the pressure control unit, and a gas supply stopping operation for stopping a supply of the gas by the gas flow rate control and supply unit are performed simultaneously.

Preferably, the substrate processing device includes: a substrate counting unit of an arm shape for counting the number of substrates accommodated in a substrate accommodating unit, the substrate transfer device being configured in a manner capable of being moved up and down, flexible and extensible, wherein, after counting the number of the substrates accommodated in the substrate accommodating unit, an elevating operation for moving up and down the substrate counting unit and a contracting operation for contracting the substrate counting unit are performed simultaneously.

Preferably, the substrate processing device includes: an accommodating chamber; a mounting table placed in the accommodating chamber to be mounted thereon the substrate, capable of moving up and down; and a pressure control unit for controlling a pressure in the accommodating chamber, wherein a pressure-up operation for increasing the pressure in the accommodating chamber by the pressure control unit and a mounting table elevating operation for moving up the mounting table are performed simultaneously.

Preferably, in the above-described substrate processing method, a pressure-down operation for decreasing the pressure in the accommodating chamber by the pressure control unit and a mounting table moving-down operation for moving down the mounting table are performed simultaneously.

Preferably, the substrate processing device includes: an accommodating chamber; a mounting table placed in the accommodating chamber to be mounted thereon the substrate; elevation pins protruded from the mounting table to move up and down the substrate; and a door unit capable of being opened and closed for connecting the substrate transfer device and the substrate processing device, wherein a pin protruding operation for protruding the elevation pins and a closing operation for closing the door unit are performed simultaneously.

In accordance with another aspect of the present invention, there is provided a substrate processing system including: a substrate processing device and a substrate transfer device, wherein the substrate processing device and the substrate transfer device include a plurality of elements, and, at least in case of processing a substrate or transferring the substrate, at least two elements among the plurality of the elements are operated simultaneously.

In accordance with still another aspect of the present invention, there is provided a substrate processing program for making a computer perform a substrate processing method used for a substrate processing system having a substrate processing device and a substrate transfer device, comprising: a substrate transferring module for transferring a substrate; and a substrate processing module for processing the substrate, wherein the substrate transferring module and the substrate processing module include a plurality of operations, and at least two of the plurality of the operations are performed simultaneously.

In accordance with the present invention, the substrate transferring step and the substrate processing step include the plurality of the operations, and at least two operations among the plurality of the operations included in the substrate transferring step or the substrate processing step are carried out simultaneously. Therefore, while a specified element of the substrate transferring device or the substrate processing device performs a specified operation, other elements not involved in the specified operation performs their own operations, thereby reducing the time needed for processing the substrate. Thus, the throughput can be enhanced greatly.

Further, the vacuum pumping operation for vacuum pumping the heat transfer gas supply line and the transferring operation for transferring the substrate into the accommodating chamber are performed simultaneously. Thus, the throughput can be enhanced markedly.

Still further, the pin protruding operation for protruding the elevation pins and the transferring operation for transferring the substrate into the accommodating chamber are performed simultaneously. Thus, the throughput can be enhanced greatly.

Still further, the pin moving-down operation for moving down the elevation pins and the taking-out operation for taking the substrate out of the accommodating chamber are performed simultaneously. Thus, the throughput can be enhanced greatly.

Still further, the taking-in operation for taking the substrate into the accommodating chamber and the pressure-up operation for increasing the pressure in the accommodating chamber by the pressure control unit are performed simultaneously. Thus, the throughput can be enhanced markedly.

Still further, the application stopping operation for stopping an application of the high frequency power by the high frequency power supply, the gas supply stopping operation for stopping a supply of the gas by the gas flow rate control and supply unit, and the vacuum pumping operation for vacuum pumping the heat transfer gas supply line are performed simultaneously. Thus, the throughput can be enhanced greatly.

Still further, the pin protruding operation for protruding the elevation pins, the pressure-down operation for decreasing the pressure in the accommodating chamber by the pressure control unit, and the gas supply stopping operation for stopping a supply of the gas by the gas flow rate control and supply unit are performed simultaneously. Thus, the throughput can be enhanced greatly.

Still further, the elevating operation for moving up and down the substrate counting unit and the contracting operation for contracting the substrate counting unit are performed simultaneously. Thus, the throughput can be enhanced significantly.

Still further, the pressure-up operation for increasing the pressure in the accommodating chamber by the pressure control unit and the mounting table elevating operation for moving up the mounting table are performed simultaneously. Thus, the throughput can be enhanced greatly.

Still further, the pressure-down operation for decreasing the pressure in the accommodating chamber by the pressure control unit and the mounting table moving-down operation for moving down the mounting table are performed simultaneously. Thus, the throughput can be enhanced markedly.

Still further, a pin protruding operation for protruding the elevation pins and a closing operation for closing the door unit are performed simultaneously. Thus, the throughput can be enhanced greatly.

Still further, at least in case of processing a substrate or transferring the substrate, at least two elements among the plurality of the elements are operated simultaneously. Thus, the throughput can be enhanced greatly.

Still further, the substrate transferring module and the substrate processing module include the plurality of the operations, and at least two operations among the plurality of the operations included in the substrate transferring module or the substrate processing module are carried out simultaneously. Therefore, while a specified element of the substrate transferring device or the substrate processing device performs a specified operation, other elements not involved in the specified operation performs their own operations, thereby reducing the time needed for processing the substrate. Thus, the throughput can be enhanced greatly.

BRIEF DESCRIPTION OF THE DRAWINGS

The above and other objects and features of the present invention will become apparent from the following description of a preferred embodiment, given in conjunction with the accompanying drawings, in which:

FIGS. 26A to 26C present sequence diagrams for illustrating the eighth example of the substrate processing method applied to the step of taking the wafer into the chamber and a fourth example of the step of taking the wafer out of the chamber shown in FIG. 4 in accordance with the preferred embodiment.

DETAILED DESCRIPTION OF THE PREFERRED EMBODIMENT

Hereinafter, a preferred embodiment will be described with reference to the drawings.

First, a substrate processing system and a substrate transferring method in accordance with the preferred embodiment will be explained.

Figure 1:
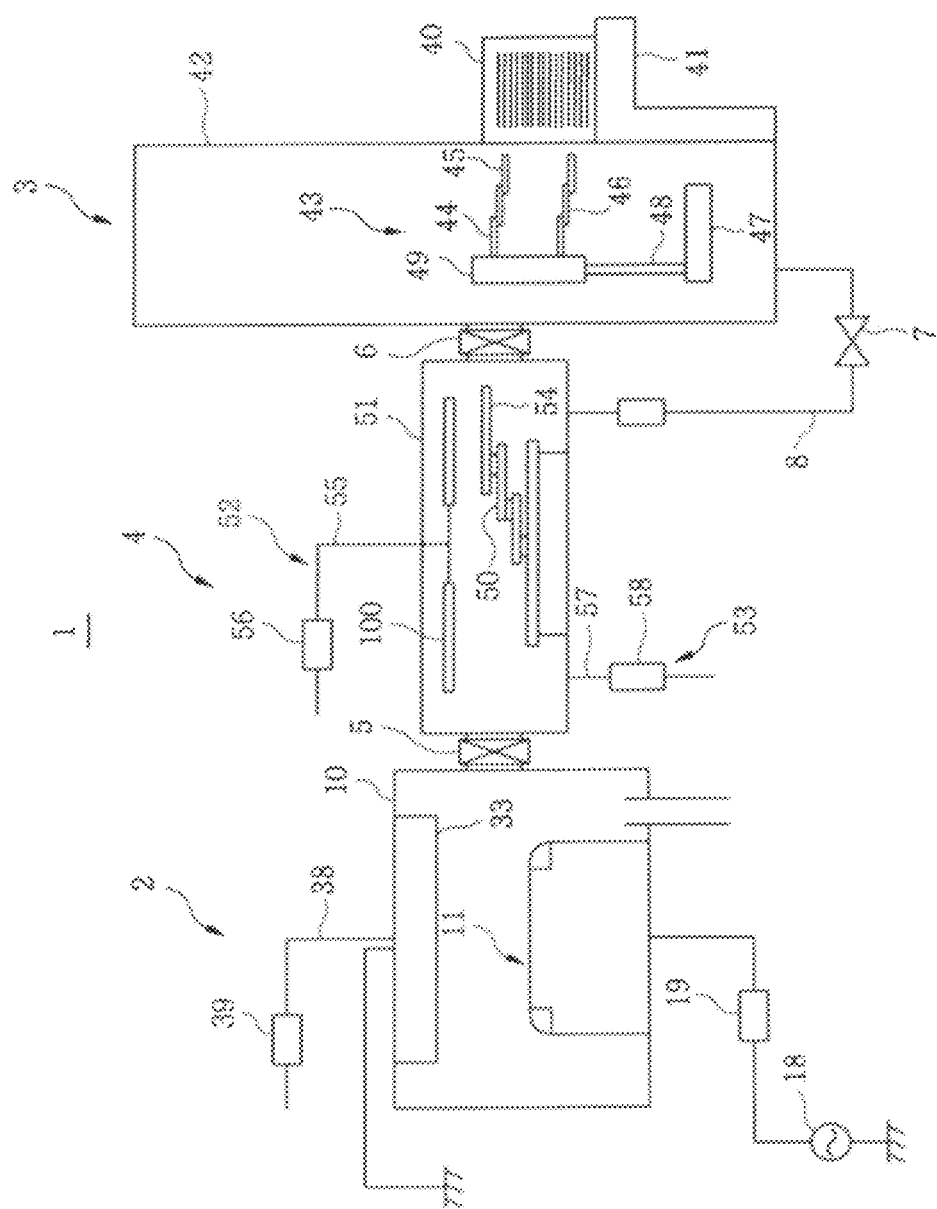
FIG. 1 shows a cross sectional view representing a conceptual configuration of a substrate processing system in accordance with the preferred embodiment.

FIG. 1 shows a cross sectional view representing a conceptual configuration of a substrate processing system in accordance with the preferred embodiment.

Referring to FIG. 1, a substrate processing system 1 includes a process module (hereinafter, referred to as "PM") 2 for performing various kinds of processes such as a film-forming process, a diffusion process and an etching process on every single semiconductor wafer W as a substrate; an atmospheric transfer unit 3 for taking out the semiconductor wafer W from a wafer cassette 40 storing a specified number of the semiconductor wafers W; a load-lock chamber (hereinafter, referred to as "LL") 4 located between the atmospheric transfer unit 3 and the PM 2 for loading and unloading the semiconductor wafer W from the atmospheric transfer unit 3 to the PM 2 or vice versa.

The insides of the PM 2 and the LL 4 are configured such that they can be vacuum pumped, and the inside of the atmospheric transfer unit 3 is always kept at an atmospheric pressure. The PM 2 is connected to the LL 4 via a gate valve 5, and the LL 4 is connected to the atmospheric transfer unit 3 via a gate valve 6. The gate valves 5 and 6 can be freely opened and closed, so that the PM 2 and the LL 4 can be made to communicate with each other or to be isolated from each other by the valve 5 and likewise, the LL 4 and the atmospheric transfer unit 3 can be made to communicate with each other or to be isolated from each other by the valve 6. Further, the inside of the LL 4 is connected to the inside of the atmospheric transfer unit 3 via a communication pipe 8 having a valve 7 that can be opened and closed in the middle thereof.

Figure 2:
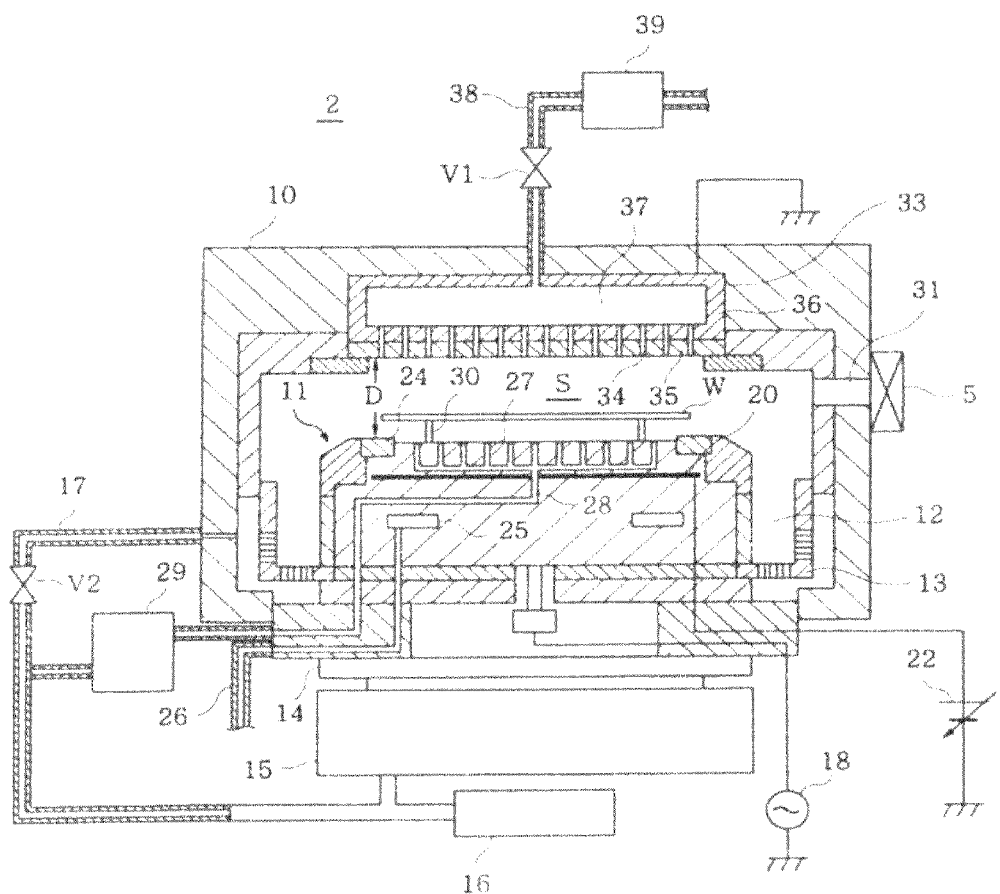
FIG. 2 illustrates a conceptual configuration of the PM shown in FIG. 1.

FIG. 2 illustrates a conceptual configuration of the PM shown in FIG. 1.

Referring to FIG. 2, the PM 2, which is configured as an etching process unit for performing an etching process on the semiconductor wafer W, includes a cylindrical chamber 10 made of metal, e.g., aluminum or stainless steel. In the chamber 10 is placed a columnar susceptor 11 serving as a stage for the semiconductor wafer W whose diameter is, e.g., 300 mm, to be mounted on.

Between the chamber 10 and the susceptor 11 is formed a gas exhaust path 12 used for exhausting gas from a space above the susceptor 11 to the outside of the chamber. In the middle of the gas exhaust path 12 is located an annular baffle plate 13, and a part of the gas exhaust path 12 below the baffle plate 13 communicates with an adaptive pressure control valve (hereinafter, referred to as "APC") 14 which is a variable butterfly valve. The APC (Adaptive Pressure Control Valve) 14 is connected to a turbo molecular pump (hereinafter, referred to as "TMP") 15 which is a gas exhaust pump used for vacuum pumping, and, via the TMP 15, also connected to a dry pump (hereinafter, referred to as "DP") 16, which is also a gas exhaust pump. A main pumping line, i.e., a gas exhaust path including the APC 14, the TMP 15 and the DP (Dry Pump) 16, controls a pressure in the chamber 10 by using the APC 14 and depressurizes the inside of the chamber 10 by using the TMP 15 and the DP 16.

Further, the part of the gas exhaust path 12 below the baffle plate 13 is connected to another pumping line (hereinafter, referred to as "rough pumping line"). The rough pumping line includes a gas exhaust pipe 17, whose diameter is, e.g., 25 mm, for making said part of the gas exhaust path 12 communicate with the DP 16 and a valve V2 installed in the middle thereof. The valve V2 can isolate the DP 16 from said part of the gas exhaust path 12. The rough pumping line exhausts gas in the chamber by using the DP 16.

The susceptor 11 is connected to a high frequency power supply 18 via a matching unit 19, and the high frequency power supply 18 applies a specified high frequency power to the susceptor 11. Thus, the susceptor 11 functions as a lower electrode. Further, the matching unit 19 reduces a reflection of the high frequency power at the susceptor 11 to maximize a supply efficiency of the high frequency power to the susceptor.

In an upper part of the inside of the susceptor 11 is installed an electrode plate 20 having a shape of a circular plate shape made of a conductive layer for elecrostatically adsorbing the wafer W. The electrode plate 20 is electrically connected to a DC power supply 22. The wafer W is maintained to be adsorbed on an upper surface of the susceptor 11 by a Johnsen-Rahbek force or a Coulomb force generated by a DC voltage applied to the electrode plate 20 by the DC power supply 22. Further, on the susceptor 11 is placed a ring-shaped focus ring 24 made of, e.g., silicon (Si) or the like. The focus ring 24 concentrates plasma generated above the susceptor 11 onto the wafer W.

In the susceptor 11 is installed an annular coolant chamber 25 extending, for example, in a circumferential direction. Coolant such as cooling water kept at a specified temperature is provided to the coolant chamber 25 from a chiller unit (not shown) via a distribution pipe 26, so that the processing temperature of the wafer W on the susceptor 11 is adjusted by the temperature of the coolant.

On a part of the upper surface of the susceptor 11 on which the wafer W is adsorbed (hereinafter, referred to as "adsorption surface") are a plurality of heat transfer gas supply openings 27 and heat transfer gas supply grooves (not shown). The heat transfer gas supply openings 27 and the heat transfer gas supply grooves are connected to a heat transfer gas supply unit 29 via the heat transfer gas supply line 28 arranged in the susceptor 11. The heat transfer gas supply unit 29 supplies a heat transfer gas such as He gas to a space between the adsorption surface and a backside of the wafer W. Further, the heat transfer gas supply unit 29 is configured such that the space between the adsorption surface and the backside of the wafer W can also be vacuum pumped.

Furthermore, on the adsorption surface is disposed a plurality of pusher pins 30 which are lift pins that can be freely moved up and down in the upper surface of the susceptor 11. The pusher pins 30 can be moved in a vertical direction by converting a motion of a motor (not shown) from a rotational one into a reciprocating linear one by using a ball screw or the like. While the wafer W is maintained to be adsorbed on the adsorption surface, the pusher pins 30 are pulled down to be accommodated within the susceptor 11. However, while the wafer W is being taken out from the chamber 10 after a plasma processing is completed, the pusher pins 30 become protruded from the upper surface of the susceptor 11 to lift and separate the wafer W from the susceptor 11.

On a ceiling portion of the chamber 10 is installed a shower head 33. The shower head 33, being earthed, functions as a grounded electrode.

The shower head 33 includes an electrode plate 35 having a plurality of gas air openings on its lower surface and an electrode supporting member 36 for supporting the electrode plate 35 such that it can be attached thereto and separated therefrom. Further, in the electrode supporting member 36 is placed a buffer chamber 37, which is connected to a processing gas inlet line 38 extended from a processing gas supply unit (not shown). In the middle of the processing gas inlet line 38 is installed an MFC (Mass Flow Controller) 39. The MFC 39 supplies a specified gas, e.g., a processing gas or an $N_2$ gas, to the chamber 10 via the buffer chamber 37 and controls a flow rate of the supplied gas to keep the pressure in the chamber 10 at a desired level with the help of the APC. Herein, a distance D between the susceptor 11 and the shower head 33 is set to be, e.g., 35±1 mm or more.

On a side wall of the chamber 10 is attached the gate valve 5 for opening and closing a loading/unloading port 31 for loading and unloading the wafer W. In the chamber 10 in the PM 2, as described above, a high frequency power is applied to the susceptor 11, and, by applying the high frequency power, a plasma is generated from the processing gas in a space S between the susceptor 11 and the shower head 33 to produce ions and radicals.

When the etching process is performed in the PM 2, at first, the gate valve 5 is opened and the wafer W as an object to be processed is transferred into the chamber 10 to be mounted on the susceptor 11. Thereafter, the processing gas, for example, a gaseous mixture of $C_4F_8$, $O_2$ and Ar gas having a specified flow rate ratio, is supplied through the shower head 33 at a specified flow rate and flow rate ratio into the chamber 10, and the pressure in the chamber 10 is kept at a specified level by using the APC 14 and the like. Further, the high frequency power is applied to the susceptor 11 from the high frequency power supply 18 and the DC voltage is applied to the electrode plate 20 from the DC power supply 22 such that the wafer W is adsorbed onto the susceptor 11. Then, the processing gas supplied through the shower head 33 becomes a plasma as described above. The radicals and the ions generated from the plasma are concentrated onto the surface of the wafer W by the action of focus ring 24, and the surface of the wafer W is etched physically or chemically.

Referring back to FIG. 1 again, the atmospheric transfer unit 3 includes a wafer cassette mounting platform 41 for mounting the wafer cassette 40 and a loader module 42 (hereinafter, referred to as "LM").

The wafer cassette mounting platform 41 has a shape of a platform whose upper surface is flat, and the wafer cassette 40 accommodates, e.g., 25 wafers W by mounting them at multiple levels with an equal pitch. Further, the LM 42, having a shape of a rectangular parallelepiped box, includes therein a Scara type transfer arm 43 for transferring the wafers W.

Furthermore, on a side wall of the LM 42 adjacent to the wafer cassette mounting platform 41 is a shutter (not shown) confronting the wafer cassette 40 mounted on the wafer cassette mounting platform 41. The shutter allows the wafer cassette 40 to communicate with the inside of the LM 42.

The transfer arm 43 includes a multi-joint arm unit 44 that can be bent, expandable and contractible and a pick 45 attached at a front end of the arm unit 44. The pick 45 is configured such that the wafer W can be mounted thereon directly. Further, the transfer arm 43 further includes a multi-joint mapping arm 46 that can be flexible and at a front end thereof installed a mapping sensor (not shown) for detecting the wafer W by, for example, emitting a laser beam. Base ends of the arm unit 44 and the mapping arm 46 are connected to an elevation unit 49 for moving up and down along an arm base supporting column 48 standing on the base portion 47 in the transfer arm 43. In addition, the arm base supporting column 48 is configured to be revolvable. During a mapping operation for detecting the number and positions of the wafers W accommodated in the wafer cassette 40, the mapping arm 46, while being extended, moves up or down to detect the number and positions of the wafers W in the wafer cassette 40.

Since the transfer arm 43 can be bent by using the arm unit 44 and can be revolved by using the arm base supporting column 48, the wafer W mounted on the pick 45 can be efficiently transferred between the wafer cassette 40 and the LL 4.

The LL 4 includes a chamber 51 in which a transport arm 50 that is flexible and revolvable is installed; an $N_2$ gas supply system 52 for supplying an $N_2$ gas into the chamber 51; and an LL gas pumping system 53 for exhausting the inside of the chamber 51.

The transport arm 50 is a Scara type transfer arm containing a plurality of arm units, and has a pick 54 attached at a front end thereof The pick 54 is configured such that the wafer W can be mounted thereon directly.

In case the wafer W is transferred from the atmospheric transfer unit 3 to the PM 2, the transport arm 50 takes the wafer W from the transfer arm 43 in the LM 42 when the gate valve 6 is opened, and, when the gate valve 5 is opened, the transport arm 50 is introduced into the chamber 10 in the PM 2 and the wafer W is mounted on the pusher pins 30 protruded from the upper surface of the susceptor 11. Further, in case the wafer W is transferred from PM 2 to the atmospheric transfer unit 3, when the gate valve 5 is opened, the transport arm 50 is introduced into the chamber 10 in the PM 2 and takes the wafer W mounted on the pusher pins 30 protruded from the upper surface of the susceptor 11, and, when the gate valve 6 is opened, the transport arm 50 transfers the wafer W to the transfer arm 43 in the LM 42.

Furthermore, the transport arm 50 is not limited to a Scara type, and a frog leg type or a double arm type arm may also be employed as the transport arm 50.

The $N_2$ gas supply system 52 includes an $N_2$ gas inlet line 55 passing through from the outside to the inside of the chamber 51; a control valve 56 installed in the middle of the $N_2$ gas inlet line 55; a couple of break filters 100 installed at a front end of the N₂ gas inlet line 55 in the chamber 51 for jetting the N₂ gas; and an N₂ gas supply device (not shown) connected to the other front end of the N₂ gas inlet line 55 outside of the chamber 51. The N₂ gas supply system 52 supplies the N₂ gas to the chamber 51 at a predetermined timing, and adjusts the pressure in the chamber 51.

Each of the break filters 100 is of a mesh shape having a length of, e.g., 200 mm, and made of metal. It can increase a jetting area of the N₂ gas to reduce a flow rate of the jetted N₂ gas, thereby uniformly raising the pressure in the chamber 51 by jetting the N2 gas uniformly onto a large area.

In an LL in the conventional substrate processing system, a length of a break filter is, e.g., 100 mm, and a jetting area of N₂ gas is small, so that the N₂ gas is jetted from the break filter at a high flow rate, causing particles in the chamber 51 to be swirled up. To avoid this problem, in the conventional LL, an SSV (Slow Start Valve) is installed in the middle of an N₂ gas inlet line for the SSV to reduce the flow rate of the N₂ gas.

On the contrary, in the LL 4 of the substrate processing system in accordance with the preferred embodiment of the present invention, the flow rate of the N2 gas is reduced by using the break filters 100, so that the particles can be prevented from being swirled up without an SSV. Further, since the jetting area of the N₂ gas is set to be large, the N₂ gas of desired volume can be quickly supplied into the chamber 51, thereby enhancing the throughput.

The LL gas pumping system 53, including a gas exhaust pipe 57 penetrating into the inside of the chamber 51 and a control valve 58 installed in the middle of the gas exhaust pipe 57, adjusts the pressure in the chamber 51 with the help of the N₂ gas supply system 52.

The operation of every element of the PM 2, the atmospheric transfer unit 3 and the LL 4 in the substrate processing system 1 is controlled by a computer (not shown) functioning as a control device contained in the substrate processing system 1 or an external server (not shown) functioning as a control device connected to the substrate processing system 1, pursuant to a program for performing the substrate processing method in accordance with the preferred embodiment of the present invention.

Although the susceptor 11 as a lower electrode is not configured to be moved with respect to the chamber 10 in the PM connected to the LL 4 in the substrate processing system 1, the PM connected to the LL 4 is not limited thereto, and, for example, it is also possible to configure the PM such that a lower electrode thereof can be moved with respect to a chamber thereof.

Figure 3:
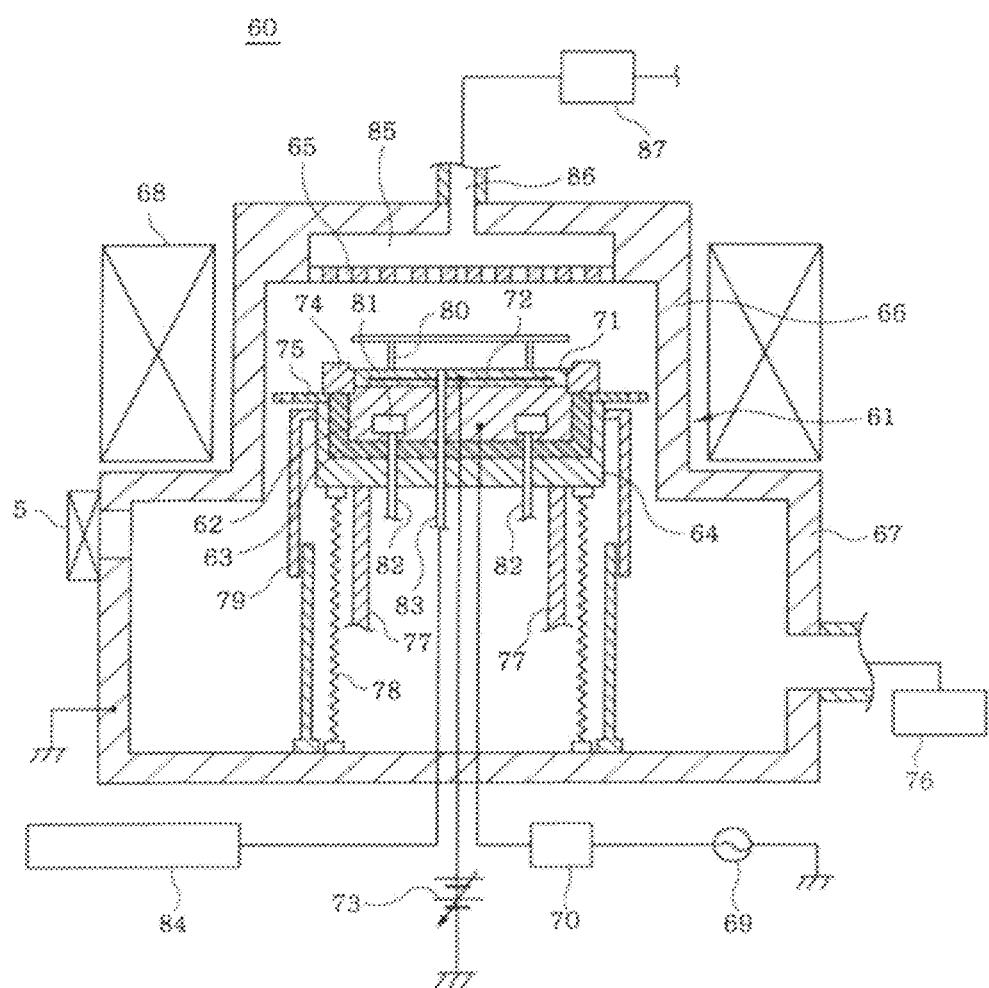
FIG. 3 is a cross sectional view depicting a conceptual configuration of another PM that can be connected to the LL in the substrate processing system shown in FIG. 1.

FIG. 3 is a cross sectional view depicting a conceptual configuration of another PM that can be connected to the LL in the substrate processing system shown in FIG. 1.

Referring FIG. 3, the PM 60, which is configured as an etching process unit for performing an etching process on the semiconductor wafer W, includes a cylindrical chamber 61 made of, e.g., aluminum; a supporting body 64 capable of moving up and down, located in the chamber 61 for supporting a lower electrode 62 on which a semiconductor wafer W whose diameter is, e.g., 200 mm is mounted via an insulator 63; and a shower head 65 as an upper electrode confronting the lower electrode 62 at an upper portion in the chamber 61.

In upper portion of the chamber 61 is formed a small-diameter upper room 66, and in lower portion of the chamber 61 is formed a large-diameter lower room 67. Around the upper room 66 is installed a dipole ring magnet 68, which generates a uniform horizontal magnetic field of a single direction. An upper portion of a side wall of the lower room 67 is attached the gate valve 5 for opening and closing the loading/unloading port of the wafer W. The PM 60 is connected to the LL 4 via the gate valve 5.

The lower electrode 62 is connected to a high frequency power supply 69 via a matching unit, and the high frequency power supply 69 applies a specified high frequency power to the lower electrode 62. Thus, the lower electrode 62 functions as a lower electrode.

An upper surface of the lower electrode 62 is placed an electrostatic chuck (ESC) 71 for electrostatically adsorbing the wafer W thereon. In the electrostatic chuck 71 is located an electrode plate 72 of a circular plate shape made of a conductive layer, which is electrically connected to a DC power supply 73. The wafer W is kept to be adsorbed on the upper surface of the electrostatic chuck 71 by a Coulomb force or the like generated by a DC voltage applied to the electrode plate from the DC power supply 73. Around the electrostatic chuck 71 is placed a focus ring 74, which concentrates plasma generated above the lower electrode 62 onto the wafer W.

Between the side wall of the upper room and the lower electrode is formed a gas exhaust path for exhausting gas above the lower electrode 62 to the outside of the chamber 61. In the middle of the gas exhaust path is located an annular evacuation plate (partitioning plate) 75. A part of the gas exhaust path below the evacuation plate 75, i.e., an inner space of the lower room 67, communicates with a pumping system 76 including a main pumping line having an APC, a TPM and a DP and a rough pumping line which serves as a bypass between the inner space of the lower room 67 and the DP. The pumping system 76 not only performs a pressure control but also a depressurization of the inside of the chamber 61 to the vacuum level.

Below the lower electrode 62 is placed a lower electrode elevation unit having a ball screw 77 installed such that it is downwardly extended from the supporting body 64. The lower electrode elevation unit supports the lower electrode 62 via the supporting body 64, and moves up and down the lower electrode 62 as a GAP by rotating the ball screw 77 by using a motor (not shown) or the like. The lower electrode elevation unit is isolated from the atmosphere in the chamber 61 by a bellows 78 around the lower electrode elevation unit and a bellows cover 79 around the bellows 78.

Further, on the lower electrode 62 is installed a plurality of pusher pins 80 that can be protruded from the upper surface of the electrostatic chuck 71. The pusher pins 80 moves up and down in a manner same as the pusher pins 30 shown in FIG. 1.

In the PM 60, when the wafer W is transferred by the transport arm 50, the lower electrode 62 moves down to a transferring position of the wafer W and the pusher pins 80 become protruded from the upper surface of the electrostatic chuck 71 to move up the wafer W to be separated from the lower electrode. Further, when an etching process is performed on the wafer W, the lower electrode 62 moves up to a processing position of the wafer W and the pusher pins 80 remain buried in the lower electrode 62, so that the electrostatic chuck 71 maintains the wafer W adsorbed thereon.

Furthermore, inside the lower electrode 62 is located, e.g., an annular coolant chamber 81 extended in a circumferential direction. To the coolant chamber 81 is supplied coolant, e.g., cooling water, kept at a specified temperature from a chiller unit (not shown) via a distribution pipe, and the temperature at which the wafer W on the lower electrode 62 is processed is adjusted by the temperature of the coolant.

On the upper surface of the electrostatic chuck 71 is placed a plurality of heat transfer gas supply openings and heat transfer gas supply grooves (not shown). The heat transfer gas supply openings and grooves are connected to a heat transfer gas supply unit 84 via a heat transfer gas supply line 83 installed in the lower electrode, and the heat transfer gas supply unit 84 supplies the heat transfer gas, e.g., He gas, into a space between the electrostatic chuck 71 and wafer W. The heat transfer gas supply unit 84 is configured such that the space between the electrostatic chuck 71 and the wafer W can be vacuum pumped.

The shower head installed on a ceiling portion of the chamber 61 is earthed and functions as a grounded electrode. Further, above the upper surface of the shower head is located a buffer chamber 85, which is connected to a processing gas inlet line 86 extended from a processing gas supply unit (not shown). In the middle of the processing gas inlet line 86 is installed an MFC 87. The MFC 87 supplies a specified gas, e.g., the processing gas or the $N_2$ gas, into the chamber 61 via the buffer chamber 85 and the shower head 65, and controls the flow rate of the supplied gas to adjust the pressure in the chamber 61 with the help of the APC.

In the chamber in the PM 60, as described above, the high frequency power is applied to the lower electrode 62, and a high density plasma is generated from the processing gas between the lower electrode 62 and the shower head 65 by the applied high frequency power to generate ions and radicals.

When the etching process is performed in the PM 60, at first, the gate valve 5 is opened and the wafer W as an object to be processed is transferred into the chamber 61. Thereafter, the processing gas, for example, a gaseous mixture of $C_4F_8$, $O_2$ and Ar gas having a specified flow rate ratio, is supplied through the shower head 65 at a specified flow rate, flow rate ratio into the chamber 61, and the pressure in the chamber 61 is set to be kept at a specified level by using the APC and the like. Further, the high frequency power is applied to the lower electrode 62 from the high frequency power supply 69 and the DC voltage is applied to the electrode plate 72 from the DC power supply 73 such that the wafer W is adsorbed onto the lower electrode 62. Then, the processing gas supplied through the shower head 65 is converted into a plasma as described above. The radicals and the ions generated from the plasma are concentrated onto the surface of the wafer W by the focus ring 74, and the surface of the wafer W is etched physically or chemically.

In the following, a substrate processing method in accordance with a preferred embodiment will be described. This substrate processing method is performed in the substrate processing system 1.

Figure 4:
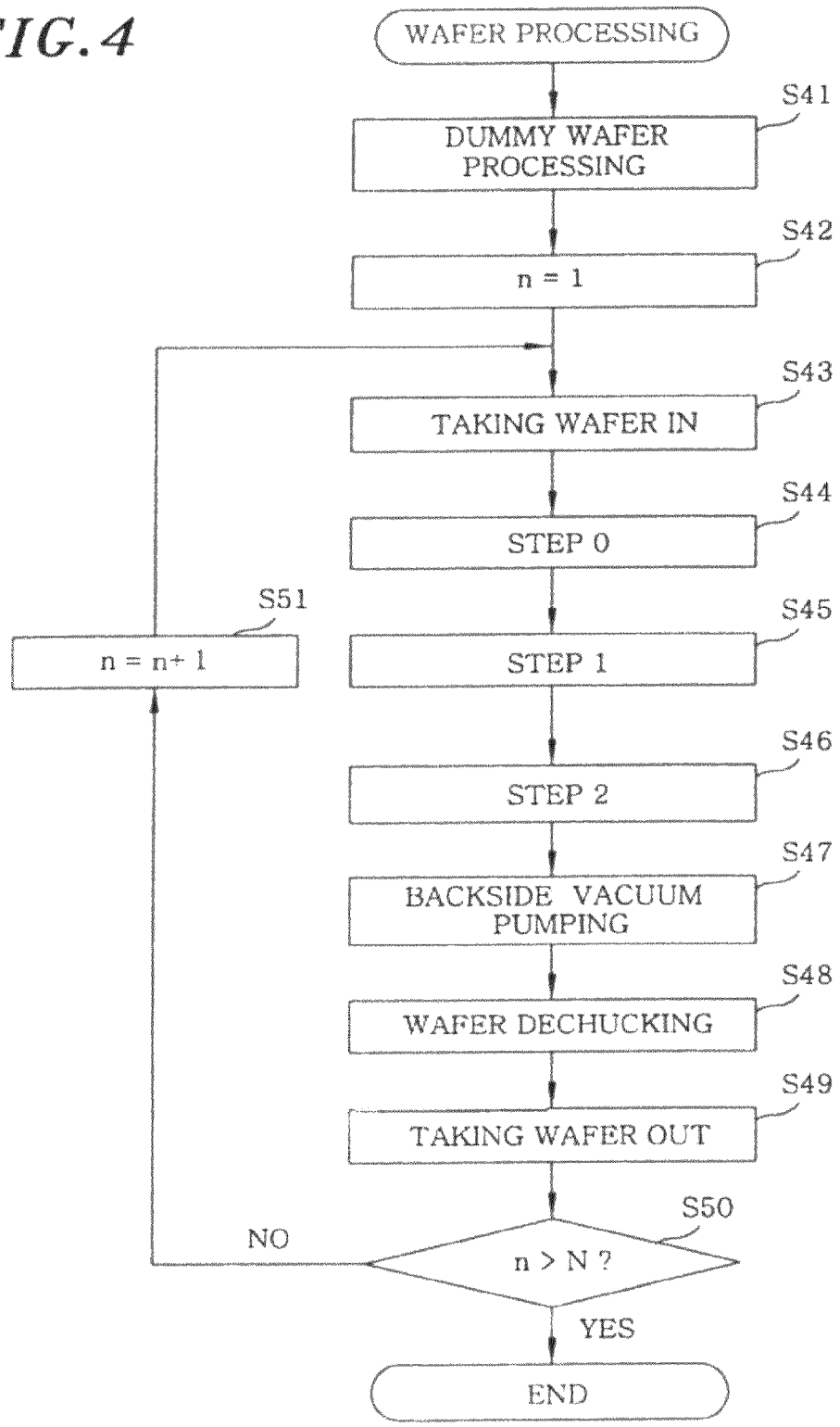
FIG. 4 provides a flow chart describing a wafer processing in accordance with the substrate processing method of the preferred embodiment. Hereinafter, the process will be described as to a case where the LL 4 is connected to the PM 2 in the substrate processing system 1.

FIG. 4 provides a flow chart describing a wafer processing in accordance with the substrate processing method of the preferred embodiment. Hereinafter, the process will be described as to a case where the LL 4 is connected to the PM 2 in the substrate processing system 1.

In FIG. 4, at first, the transfer arm 43 in the atmospheric transfer unit 3 and the transport arm 50 in the LL 4 transfer a dummy wafer from the wafer cassette 40 to the chamber 10 in the PM, and the PM performs a dummy processing for arranging a processing environment in the chamber 10 by using the dummy wafer (step S41).

Thereafter, a control unit connected to the substrate processing system 1 sets a counter n to be "1" (step S42). Next, the transfer arm 43 in the atmospheric transfer unit 3 and the transport arm 50 in the LL 4 transfer the wafer W which is not yet processed into the chamber 10 in the PM 2 from the wafer cassette 40 (step S43). Then, the PM 2 performs a step-0 operation for setting the pressure in the chamber 10 to be at a level of an adsorption pressure of the wafer W before the etching process (hereinafter, referred to as "process pressure") by using the APC 14 and the MFC 39 (step S44).

When the pressure in the chamber 10 reaches the process pressure, the PM 2 performs a step-1 operation for keeping the wafer W adsorbed on the upper surface of the susceptor 11 by using the electrode plate 20 and supplying the He gas into the space between the adsorption surface of the susceptor 11 and the backside of the wafer W by using the heat transfer gas supply unit 29 (step S45).

Thereafter, the PM 2 performs a step-2 operation for generating ions and radicals by generating a high density plasma from the processing gas in the space S by using the high frequency power applied to the susceptor 11 and performing the etching process on the wafer W by using the ions and the like (step S46).

Subsequently, the PM 2 vacuum pumps to perform a backside exhaustion for removing He gas by exhausting the heat transfer supply openings 27 and the heat transfer supply line 28 to prevent the wafer W from bouncing during the subsequent dechucking (step S47). Then, the wafer dechucking is performed for removing electrostatic charges on the wafer W by applying a reverse voltage to the electrode plate 20 or the plasma to the wafer W, as will be described in the following.

Next, the transfer arm 43 in the atmospheric transfer unit 3 and the transport arm 50 in the LL 4 take out the wafer on which the etching process is performed from the chamber 10 to transfer the wafer W into the wafer cassette 40 (step S49).

Thereafter, the control unit detects whether the value of the counter n is greater than a predetermined value N representing a predetermined number of wafers to be processed (step S50). If the value of n is equal to or smaller than the predetermined value N, the process is returned to the step S43; otherwise, the process is completed.

In this wafer processing process, each of the steps S43 and S49 (substrate transfer steps) and the steps S44 and S48 (substrate processing steps) includes a plurality of operations. For example, the step S43 includes a gate valve opening operation for opening the gate valve 5; a pusher pin protruding operation for protruding the pusher pins 30 from the upper surface of the susceptor 11; a transport arm moving operation for moving the transport arm 50 into the chamber 10; a purging operation for opening the APC completely; and an $N_2$ gas cutting-off operation for stopping to supply the $N_2$ gas into the chamber 10 by the MFC 39.

Whereas a plurality of operations included in each step are sequentially carried out in the conventional substrate processing method, at least two operations among the plurality of operations included in the steps shown in FIG. 4 are performed simultaneously in the substrate processing method in accordance with the preferred embodiment. For example, in the step S43, the purging operation, the $N_2$ gas cutting-off operation and the pusher pin protruding operation are performed simultaneously.

Further, a wafer processing process performed in case the LL 4 is connected to the PM 60 in the substrate processing system 1 is same as that shown in FIG. 4.

In accordance with the substrate processing method of the preferred embodiment, at least two operations among the plurality of operations included in the steps shown in FIG. 4 are carried out simultaneously. Therefore, while a specified device in the PM 2, the atmospheric transfer unit 3 or the LL 4 performs a specified operation, other devices not involved in the specified operation performs their own operations, thereby reducing the time needed for the etching process on the wafer W and greatly enhancing the throughput.

Further, by using the substrate processing apparatus in accordance with the preferred embodiment, at least two devices in the PM 2, the atmospheric transfer unit 3 or the LL are operated simultaneously in at least one step among the steps shown in FIG. 4, thereby reducing the time needed for the etching process on the wafer W to enhance the throughput greatly.

In the following, there will be given an explanation on specified examples of the substrate processing method in accordance with the preferred embodiment in case the LL 4 is connected to the PM 2 in the substrate processing system 1. Further, in FIG. 5 and the drawings thereafter, solid lines are related to the substrate processing method in accordance with the preferred embodiment and dotted lines are related to the conventional substrate processing method.

Figure 5:
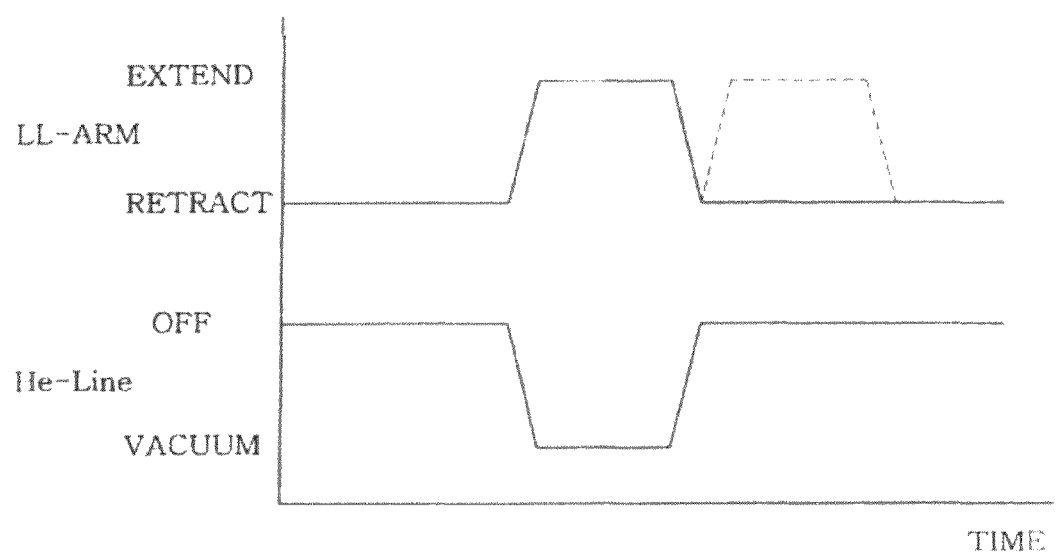
FIG. 5 represents a sequence chart describing a first example of the substrate processing method in accordance with the preferred embodiment, that is applied to the step of transferring the wafer W into the chamber 10 shown in FIG. 4.

FIG. 5 represents a sequence chart describing a first example of the substrate processing method in accordance with the preferred embodiment, applied to the step of transferring the wafer W into the chamber 10 shown in FIG. 4.

In the conventional method, when the wafer W is transferred into the chamber 10, at first, the heat transfer gas supply unit vacuum pumps the heat transfer gas supply line (VACUUM). After the vacuum pumping is completed (OFF), the transport arm is extended into the chamber 10 (EXTEND) to mount the wafer W onto the upper ends of the pusher pins, and the transport arm is retracted to withdraw from the chamber 10 (RETRACT). However, the substrate processing method in accordance with the preferred embodiment, the heat transfer gas supply unit 29 starts to vacuum pump the heat transfer gas supply line 28, and, at the same time, the transport arm 50 is extended into the chamber 10 and retracted out of the chamber 10 right after the vacuum pumping is completed.

Thus, the vacuum pumping of the heat transfer gas supply line 28 and the transfer of the wafer W are performed simultaneously, thereby greatly enhancing the throughput.

Further, in the conventional PM, since a vibration occurs by inertial force when the transport arm stops, a delay time is required between an operation of stopping transport arm and the next operation, e.g., an operation of receiving the wafer W. However, in the PM 2 in accordance with the preferred embodiment, it is possible to abolish the delay time by optimizing the gain of the movement control of the transport arm 50 in the PM 2. Thus, the throughput can be further enhanced greatly.

FIGS. 6A to 6D and FIG. 7A present sequence charts describing a second example of the substrate processing method in accordance with the preferred embodiment, applied to the step of transferring the wafer W into the chamber 10 shown in FIG. 4.

In the conventional method, the pusher pins have two setting positions. One is an accommodated position (DOWN) corresponding to a case where the pusher pins are accommodated inside of the susceptor, and the other is a wafer receiving position (UP) corresponding to a case where the pusher pins receives the wafer W from the transport arm. In the substrate processing method in accordance with the preferred embodiment, the pusher pins has another position, i.e., a waiting position (WAIT) corresponding to a case where the pusher arms wait for the transport arm 50 to come into the chamber 10.

Figure 6A:
FIGS. 6A to 6D present sequence charts describing a second example of the substrate processing method in accordance with the preferred embodiment, that is applied to the step of transferring the wafer W into the chamber 10 shown in FIG. 4.
Figure 6B:
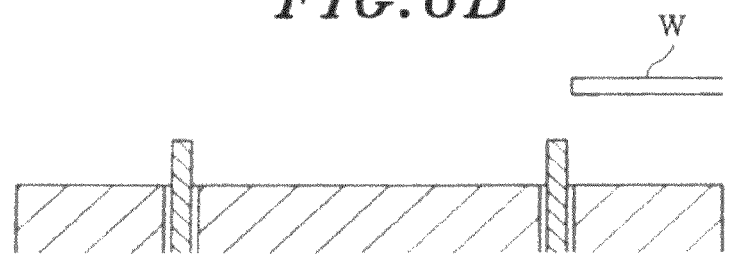
Figure 6C:
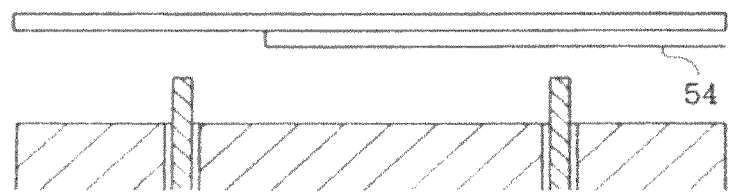
Figure 6D:
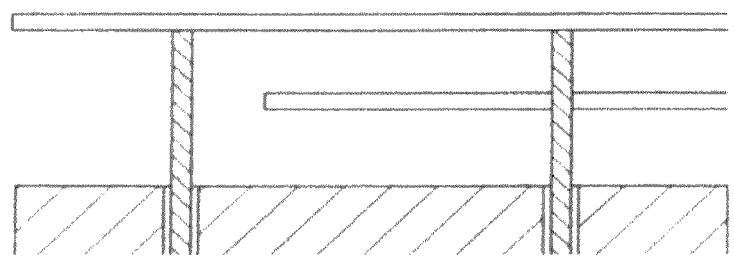

Further, in the conventional substrate processing method, when the wafer W is transferred into the chamber 10, the pusher pins become protruded to reach the receiving position after the transport arm stops to be extended. However, in the substrate processing method in accordance with the preferred embodiment, the pusher pins 30 at the accommodated position (as shown in FIG. 6A) become protruded to reach the waiting position (as shown in FIG. 6B) when the transport arm 50 starts to be extended to enter the chamber 10. Then, the pusher pins do not move until the wafer W mounted on the pick 54 is transferred to a position above the susceptor 11 (as shown in FIG. 6C). After the transport arm 50 stops to be extended, the pusher pins 30 become further protruded to reach the receiving position to receive the wafer W (as shown in FIG. 6D).

Thus, the pusher pins 30 are protruded at the same time when the wafer W is transferred into the chamber 10, thereby enhancing the throughput greatly.

Further, since the pusher pins 30 are preferably raised by a shorter distance, i.e., from the waiting position to the receiving position, after the transport arm 50 stops to be extended, an operation of receiving the wafer W can be completed in a shorter time, thereby further enhancing the throughput significantly.

In addition, whereas the elevating speed of the pusher pins in the conventional PM is 15 mm/sec, that of the pusher pins 30 in the PM 2 is set to be 25 mm/sec, thereby enhancing the throughput remarkably.

Figure 7A:
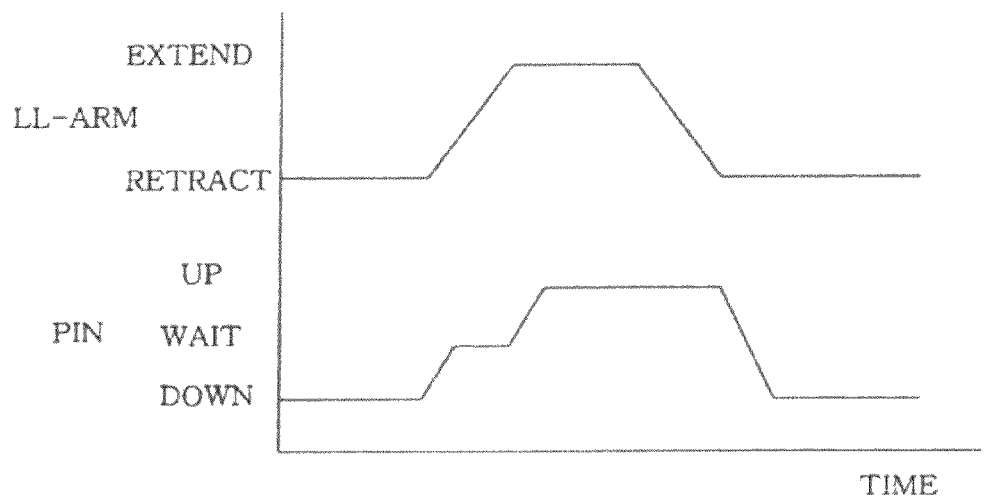
FIGS. 7A and 7B depict sequence charts respectively describing a first and a second example of the substrate processing method in accordance with the preferred embodiment, respectively applied to the step of transferring the wafer W into the chamber 10 and the step of transferring the wafer W out of the chamber 10 shown in FIG. 4.
Figure 7B:
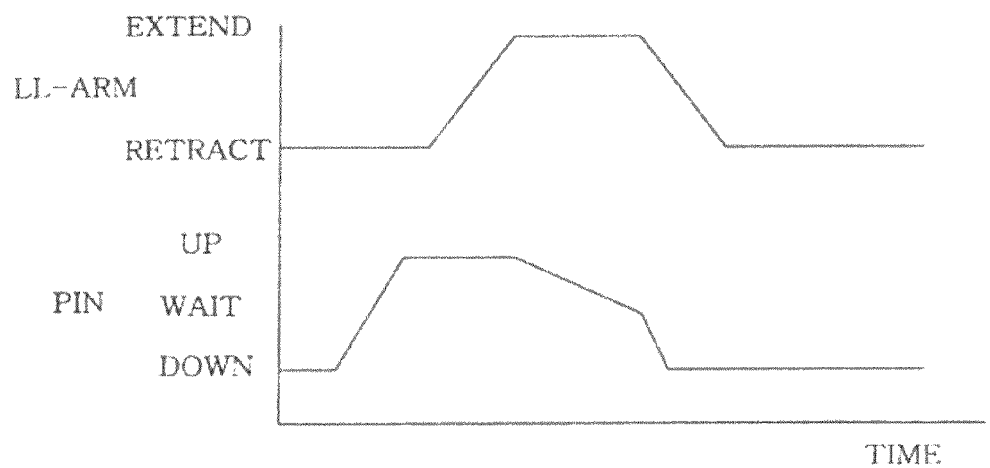

FIG. 7B is a sequence chart for representing a first example of the substrate processing method in accordance with the preferred embodiment, applied to the step of taking the wafer W out of the chamber 10 shown in FIG. 4.

In the conventional substrate processing method, when the wafer W is transferred out of the chamber, the pusher pins move down from the receiving position to the accommodated position after the transport arm is retracted to withdraw from the chamber 10. However, in accordance with the substrate processing method in accordance with the preferred embodiment, the pusher pins 30 at the accommodated position become protruded to reach the receiving position to mount the wafer W and then stop to move. After the transport arm 50 stops to be extended, the pusher pins 30 move down to the waiting position. Subsequently, when the transport arm 50 taking the wafer W starts to withdraw from the chamber 10, the pusher pins 30 move down to the accommodated position again.

Thus, the pusher pins 30 move down at the same time when the wafer W is transferred out of the chamber 10, thereby enhancing the throughput greatly.

Figure 8:
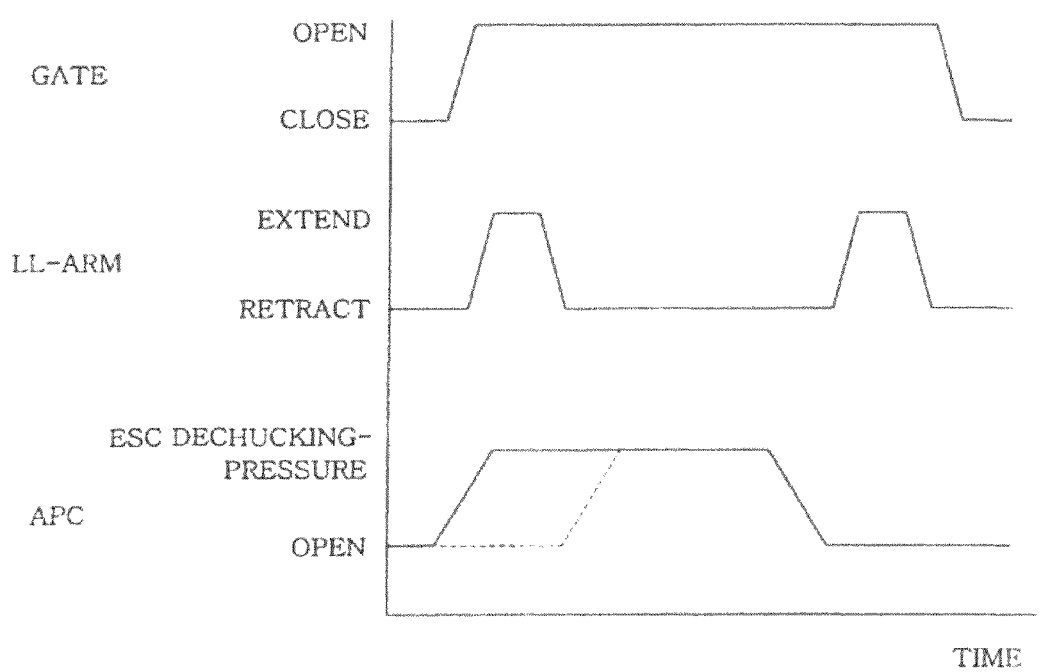
FIG. 8 shows a sequence chart for illustrating a third example of the substrate processing method in accordance with the preferred embodiment, applied to the step of taking the wafer W into the chamber 10 shown in FIG. 4.

FIG. 8 shows a sequence chart for illustrating a third example of the substrate processing method in accordance with the preferred embodiment, applied to the step of taking the wafer W into the chamber 10 shown in FIG. 4.

In the conventional substrate processing method, when the wafer W is transferred into the chamber 10, the gate valve, which has kept the loading/unloading port closed (CLOSE), is opened (OPEN). Then, after the transport arm, which already transferred the wafer W, withdraws from the chamber, the APC is completely opened to switch from an OPEN mode for purging the inside of the chamber to an ESC dechucking-pressure mode for maintaining the pressure in the chamber at an ESC dechucking-pressure, i.e., a pressure for neutralizing the susceptor. However, in the substrate processing method in accordance with the preferred embodiment, the gate valve 5 which has kept the loading/unloading port 31 closed is opened, and, when the transport arm 50 on which the wafer W is mounted starts to be introduced into the chamber 10, the APC 14 is switched from the OPEN mode to the ESC dechucking-pressure mode.

Thus, the wafer W is transferred into the chamber at the same time when the APC is switched from the OPEN mode to the ESC dechucking-pressure mode, thereby enhancing the throughput remarkably.

Figure 9:
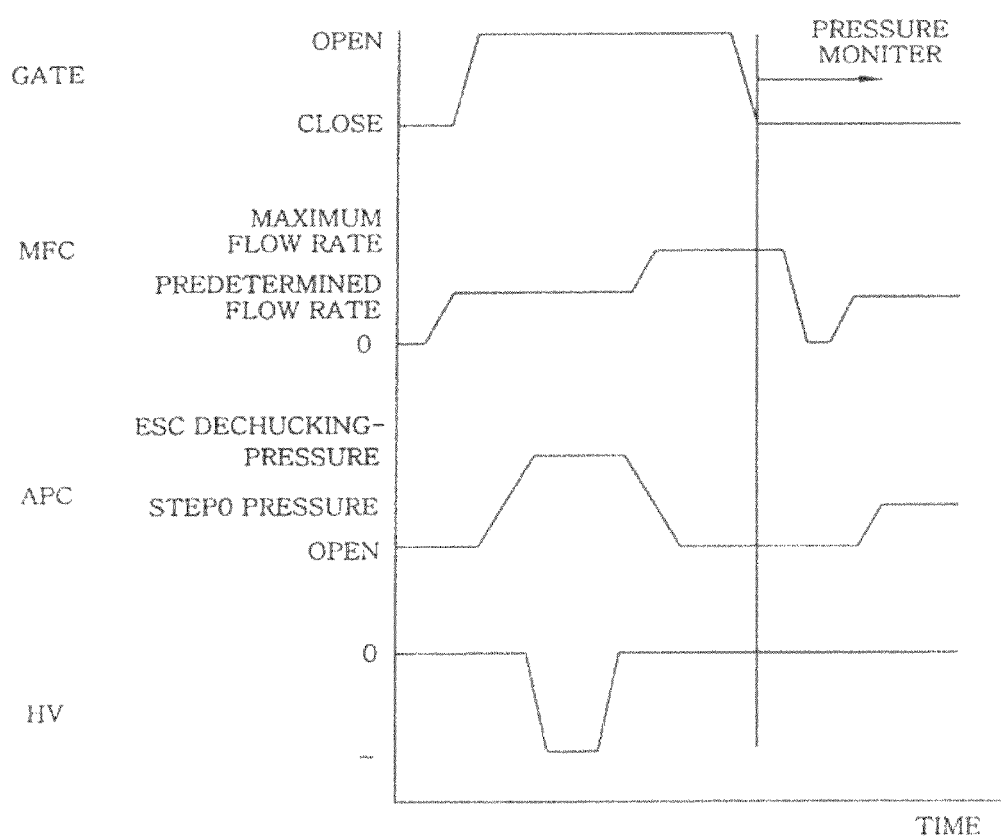
FIG. 9 illustrates a sequence chart for illustrating a fourth example of the substrate processing method in accordance with the preferred embodiment, that is applied to the step of transferring the wafer W into the chamber 10 shown in FIG. 4.

FIG. 9 illustrates a sequence chart for illustrating a fourth example of the substrate processing method in accordance with the preferred embodiment, applied to the step of transferring the wafer W into the chamber 10 shown in FIG. 4.

In the conventional substrate processing method, when the wafer W is transferred into the chamber, a DC power supply HV is switched from a HV reverse applied voltage mode for applying a reverse voltage to the electrode plate for dechucking of the susceptor to a non-applied voltage mode (designated by "0") for not applying the voltage to the electrode plate, and further, the APC is switched from the ESC dechucking-pressure mode to the OPEN mode and the main pumping line of the PM starts to be vacuum pumped. Subsequently, after a specified time, e.g., 10 seconds, elapses from the time of the switching from the HV reverse applied voltage mode to the non-applied voltage mode, the MFC is switched from a maximum supply mode (designated by "max flow rate") for supplying the inside of the chamber with the $N_2$ gas at a maximum flow rate to a non-supply mode (designated by "0") for not supplying gas into the chamber. Thereafter, the APC is switched from the OPEN mode to a STEP0 pressure mode for rapidly increasing the pressure in the chamber to the process pressure, and the vacuum pumping of the main pumping line in the PM is completed. Further, the gate valve closes the loading/unloading port before the MFC is switched to the non-supply mode.

However, in the substrate processing method in accordance with the preferred embodiment, the pressure in the chamber 10 is monitored after the loading/unloading port is closed by the gate valve 5, and, if the monitored pressure is lower than a specified pressure, the MFC 39 is switched from the maximum supply mode to the non-supply mode. Thereafter, the APC 14 is switched from the OPEN mode to the STEP0 pressure mode, and the vacuum pumping of the main pumping line and the like in the PM 2 is completed.

Thus, since the vacuum pumping of the main pumping line and the like in the PM 2 is performed based on the pressure in the chamber 10, the throughput can be enhanced without further performing the vacuum pumping excessively.

Figure 10:
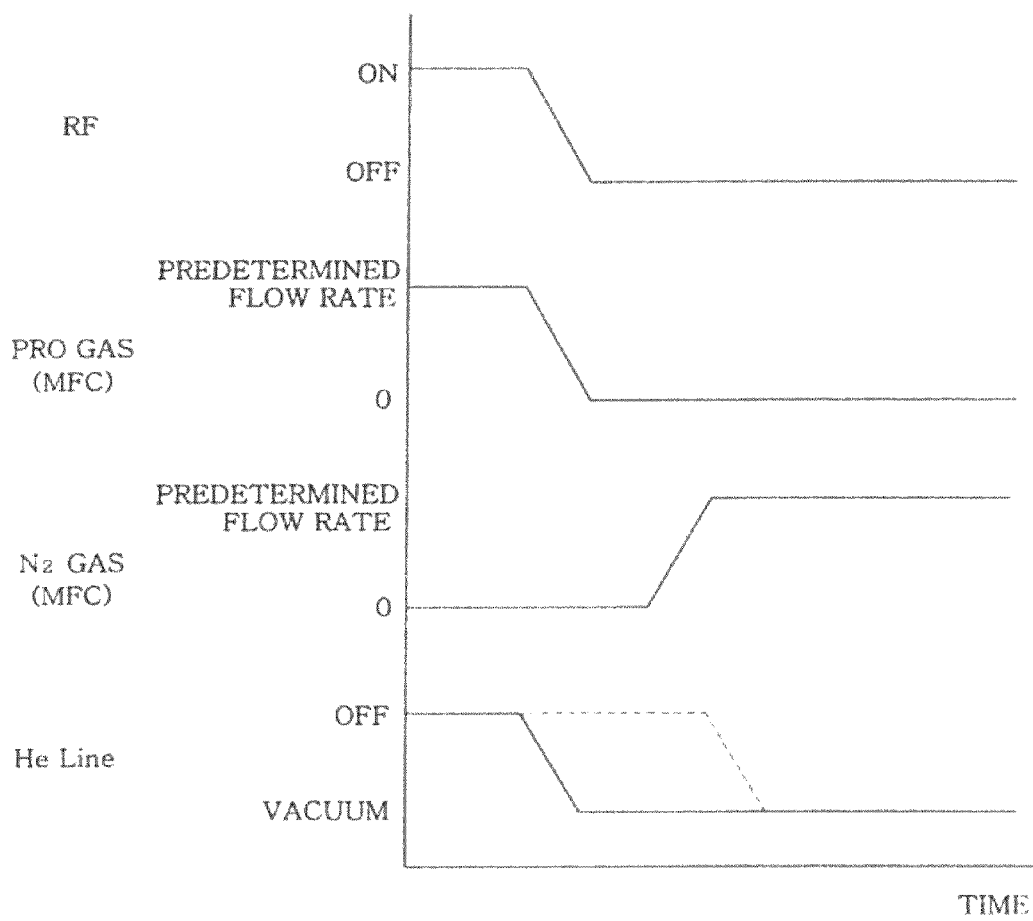
FIG. 10 presents a sequence chart for depicting the first example of the substrate processing method in accordance with the preferred embodiment, that is applied to the step of vacuum pumping the backside shown in FIG. 4.

FIG. 10 presents a sequence chart for depicting a first example of the substrate processing method in accordance with the preferred embodiment, applied to the step of vacuum pumping the backside shown in FIG. 4.

Conventionally, when vacuum pumping the rear side of the semiconductor wafer W, the high frequency power supply RF is switched from a high frequency power supply mode (ON) for supplying the susceptor with a high frequency power to a non-supply mode (OFF) for not supplying the susceptor with the high frequency power. Meanwhile, the MFC is switched from a predetermined processing gas flow rate mode (PREDETERMINED FLOW RATE of PRO GAS) for supplying the processing gas into the chamber at a predetermined flow rate to keep the inside of the chamber to be at the process pressure to a non-supply mode, and then, the MFC is switched from a non-supply mode to a predetermined $N_2$ gas flow rate mode (PREDETERMINED FLOW RATE of $N_2$ GAS) for supplying the $N_2$ gas into the chamber at a predetermined flow rate to perform the $N_2$ gas purge in the chamber. Further, the heat transfer gas supply unit vacuum pumps the heat transfer gas supply line.

However, in the substrate processing method in accordance with the preferred embodiment, the high frequency power supply 18 is switched from the high frequency supply mode to the non-supply mode, and the MFC 39 is switched from the predetermined processing gas flow rate mode to the non-supply mode. Meanwhile, the heat transfer gas supply unit 29 vacuum pumps the heat transfer gas supply line 28, and, thereafter, the MFC 39 is switched to the predetermined $N_2$ gas flow rate mode.

Thus, the transition from the high frequency power supply mode to the non-supply mode of the high frequency power supply 18, the transition from the predetermined processing gas flow rate mode to the non-supply mode of the MFC 39 and the vacuum pumping of the heat transfer gas supply line 28 in the heat transfer gas supply unit 29 can be performed simultaneously, thereby markedly enhancing the throughput.

Figure 11:
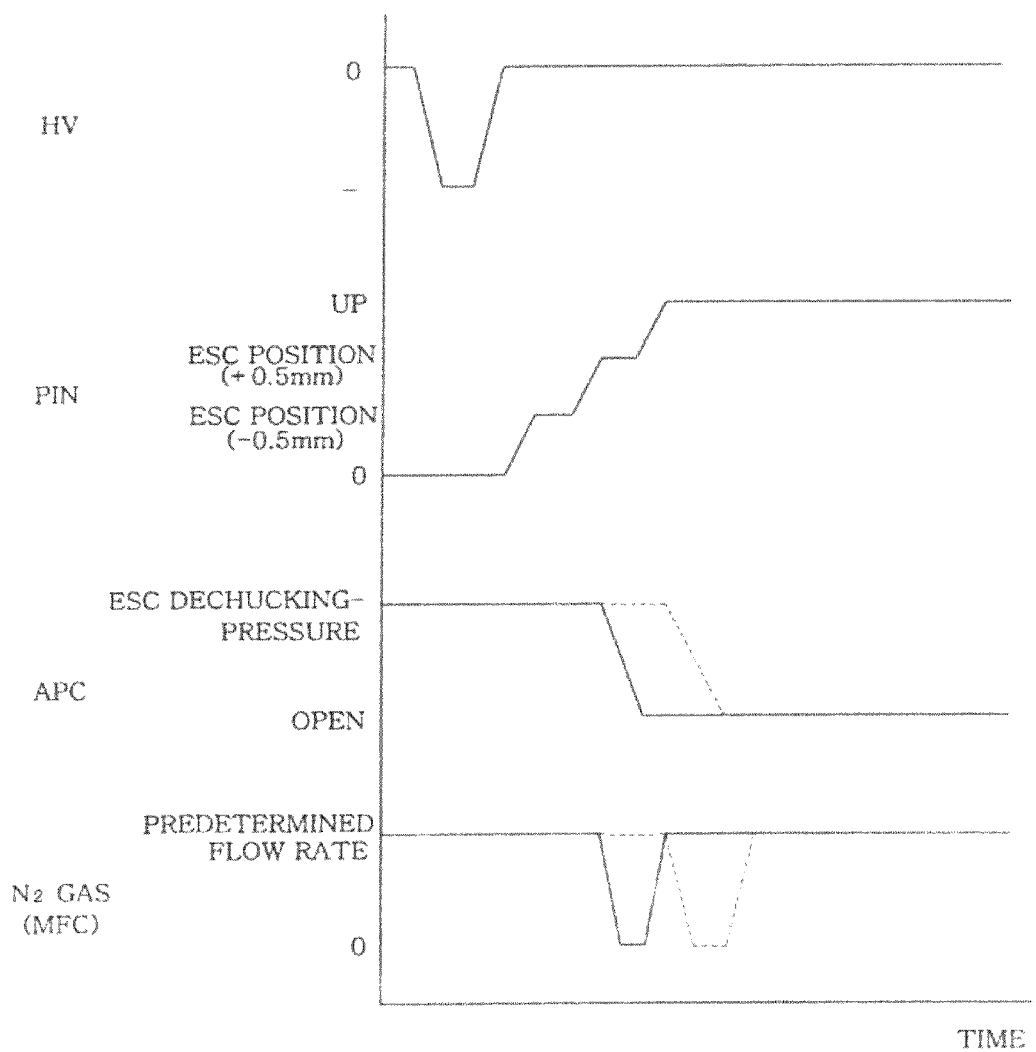
FIG. 11 provides a sequence chart for describing the fifth example of the substrate processing method in accordance with the preferred embodiment, that is applied to the step of taking the wafer into the chamber shown in FIG. 4.

FIG. 11 provides a sequence chart for describing a fifth example of the substrate processing method in accordance with the preferred embodiment, applied to the step of taking the wafer into the chamber shown in FIG. 4.

Conventionally, in case of transferring the wafer into the chamber, firstly the DC power supply is switched from the HV reverse applied voltage mode to the non-applied voltage mode, and the pusher pins are protruded from the accommodated position to the receiving position. Thereafter, the APC is switched from the ESC dechucking-pressure mode to the OPEN mode, and at the same time, the MFC is switched from the predetermined $N_2$ gas flow rate mode to the non-supply mode. After a specified time has elapsed, the MFC is switched to the predetermined $N_2$ gas flow rate mode again.

However, in the substrate processing method in accordance with the preferred embodiment, when the DC power supply 22 is switched from the HV reverse applied voltage mode to the non-applied voltage mode, the pusher pins 30 are moved up from the accommodated position to a first waiting position (designated by "ESC position–0.5 mm" in FIG. 11) which is lower than the surface of the susceptor 11 by about 0.5 mm. After a specified time has elapsed, the pusher pins 30 starts to be moved up from the first waiting position to a second waiting position (designated by "ESC position+0.5 mm" in FIG. 11) which is higher than the surface of the susceptor 11 by about 0.5 mm, and then the APC 14 is switched from the ESC dechucking-pressure mode to the OPEN mode, and the MFC 39 is switched from the predetermined $N_2$ gas flow rate mode to the non-supply mode.

Thus, the elevation of the pusher pins 30, the transition from the ESC dechucking-pressure mode to the OPEN mode of the APC 14 and the transition from the predetermined $N_2$ gas flow rate mode to the non-supply mode of the MFC 39 are performed simultaneously, thereby markedly enhancing the throughput.

Figure 12:
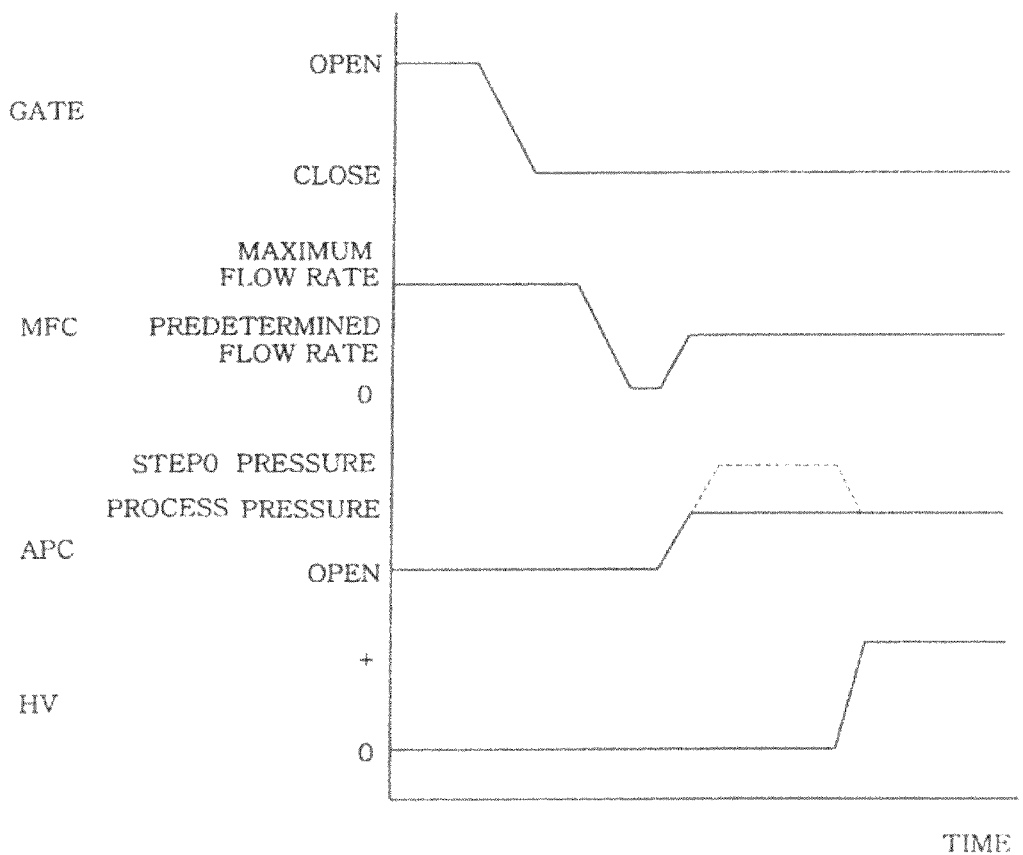
FIG. 12 is a sequence chart for showing the first example of the substrate processing method in accordance with the preferred embodiment, that is applied to the STEP0 shown in FIG. 4.

FIG. 12 is a sequence chart for showing a first example of the substrate processing method in accordance with the preferred embodiment, that is applied to the STEP0 shown in FIG. 4.

Conventionally, in case the pressure in the chamber is changed to the process pressure, firstly the loading/unloading port is closed by the gate valve, and the MFC is switched from the maximum supply mode to the non-supply mode. Thereafter, the MFC is switched from the non-supply mode to the predetermined processing gas flow rate mode, and, at the same time, the APC is witched from the OPEN mode to the STEP0 pressure mode. After a specified time has elapsed, the DC power supply is switched from the non-applied voltage mode to the HV application mode for applying the DC voltage to the electrode plate.

However, in the substrate processing method in accordance with the preferred embodiment, after the MFC 39 is switched from the maximum supply mode to the non-supply mode, then the MFC 39 is switched from the non-supply mode to the predetermined processing gas flow rate mode. Meanwhile, if a target pressure of the STEP0 pressure mode is set to be equal to or lower than the process pressure, i.e., the predetermined pressure at a STEP1, the APC 14 is switched from the OPEN mode to the process pressure mode for maintaining the pressure in the chamber to be at the process pressure. On the other hand, if the target pressure of the STEP0 pressure mode is higher than the process pressure, the APC 14 is switched from the OPEN mode to the STEP0 pressure mode, and, after a specified time has elapsed, the APC 14 is switched from the STEP0 mode to the process pressure mode.

Thus, the APC 14 selects a preferable mode based on the target pressure at the STEP0 pressure mode, thereby markedly enhancing the throughput without further increasing the pressure.

Figure 13:
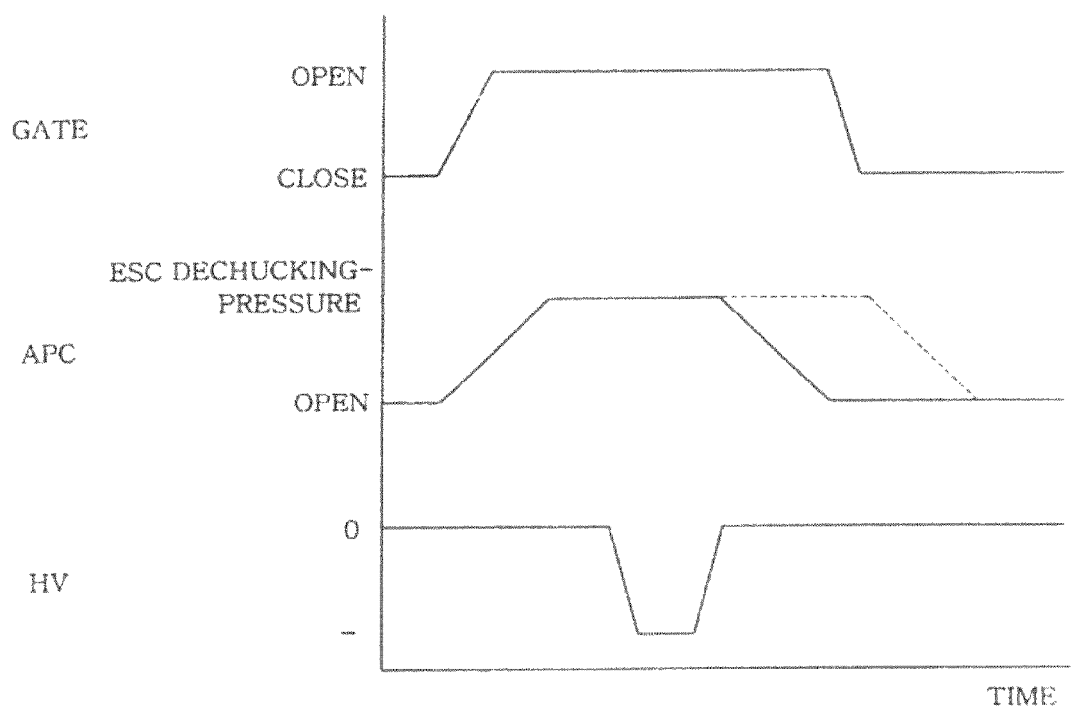
FIG. 13 illustrates a sequence chart for explaining a sixth example of the substrate processing method in accordance with the preferred embodiment, that is applied to the step of taking the wafer into the chamber shown in FIG. 4.

FIG. 13 illustrates a sequence chart for explaining a sixth example of the substrate processing method in accordance with the preferred embodiment, applied to the step of taking the wafer into the chamber shown in FIG. 4.

Conventionally, in case of transferring the wafer W into the chamber, firstly the APC is switched from the OPEN mode to ESC dechucking-pressure mode before the wafer W is transferred into the chamber. Thereafter, the DC power supply unit is switched from the non-applied voltage mode to the HV reverse applied voltage mode and then the HV reverse applied voltage mode to the non-applied voltage mode, thereby making the susceptor charge-neutralized. After the wafer W as an object to be processed is transferred into the chamber, the gate valve closes the loading/unloading port, and then the APC is switched from the ESC dechucking-pressure mode to the OPEN mode. In this case, since the time needed for the transition from the ESC dechucking-pressure mode to the OPEN mode of the APC is longer than the time needed for the gate valve to be closed, the transition to the OPEN mode of the APC continues for a while even after the gate valve is closed.

However, in the substrate processing method in accordance with the preferred embodiment, right after the DC power supply 22 is switched from the HV reverse applied voltage mode to the non-applied voltage mode, the APC 14 is switched from the ESC dechucking-pressure mode to the OPEN mode. After the transition to the OPEN mode of the APC is completed, the gate valve 5 closes the loading/unloading port 31.

Thus, the transition to the OPEN mode of APC 14 does not continue any more after the gate valve 5 is closed, thereby significantly enhancing the throughput.

Figure 14:
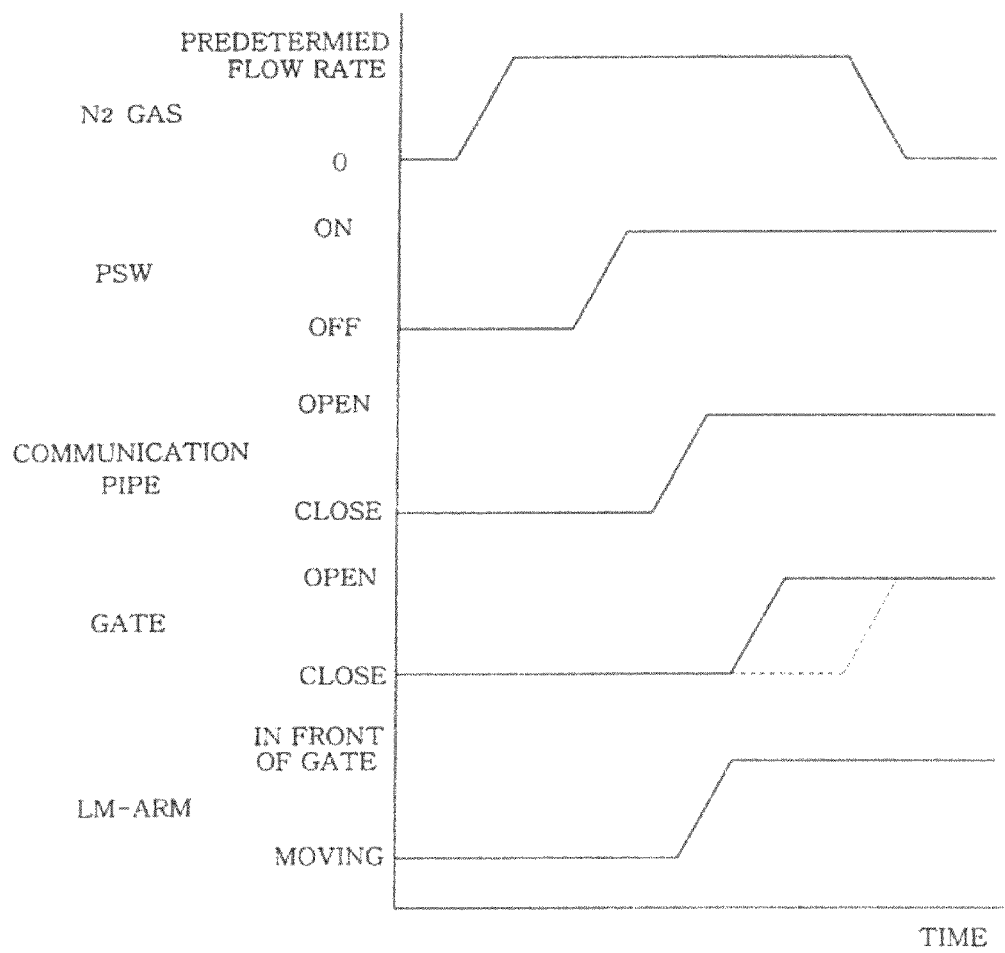
FIG. 14 is a sequence chart for showing an example of a case where the wafer W is transferred between the LL and the atmospheric transfer unit.

FIG. 14 is a sequence chart for showing an example of a case where the wafer W is transferred between the LL and the atmospheric transfer unit.

In the conventional substrate processing system, in case the wafer W is transferred between the LL and the atmospheric transfer unit, firstly the $N_2$ gas supply unit supplies the $N_2$ gas into the chamber in the LL at a predetermined flow rate, and, after a PSW (Pressure SWitch) in the LL is switched from OFF to ON and then to an atmospheric atmosphere mode, the valve of the communication pipe is opened to let it communicate with the LM. After a specified time has elapsed from the PSW being switched to ON, the gate valve is opened.

However, in the substrate processing method in accordance with the preferred embodiment, after a PSW (not shown) in the LL 4 is switched from OFF to ON and then to the atmospheric atmosphere mode, the valve of the communication pipe is opened to let it communicate with the LM. When the transfer arm 43 is moved to a front of the gate valve 6 after the PSW being switched to ON, the gate valve is opened.

Thus, the transfer arm 43 need not wait in front of the gate valve 6 after the transfer arm 43 is moved to the front of the gate valve 6, thereby markedly enhancing the throughput.

Figure 15:
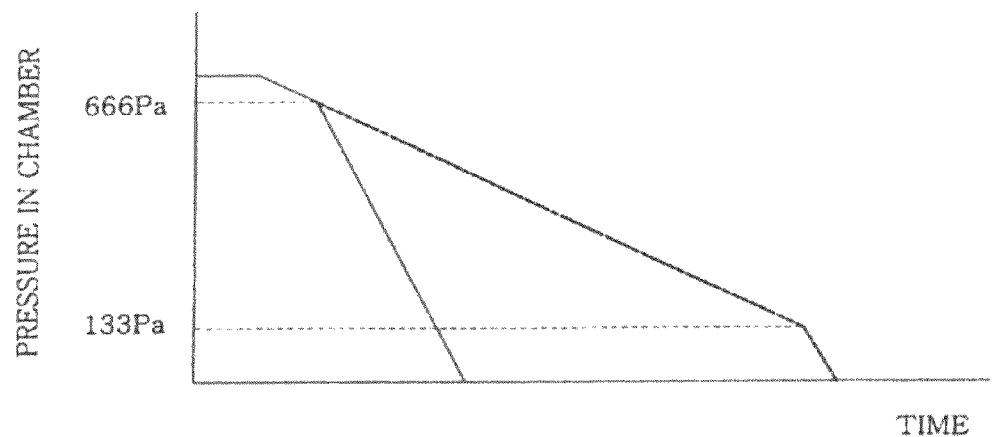
FIG. 15 depicts a sequence chart for showing a second example of the substrate processing method in accordance with the preferred embodiment, that is applied to the step of taking the wafer out of the chamber shown in FIG. 4.

FIG. 15 is a sequence chart for showing a second example of the substrate processing method in accordance with the preferred embodiment, that is applied to the step of taking the wafer out of the chamber shown in FIG. 4.

Conventionally, in case of taking the wafer w out of the chamber, before the APC is switched from the ESC dechucking-pressure mode to the OPEN mode, the rough pumping line starts to exhaust the inside of the chamber. Then, if the pressure in the chamber is decreased to, e.g., 133 Pa (100 Torr), the APC is switched to the OPEN mode, and the main pumping line starts to exhaust the inside of the chamber.

However, in the substrate processing method in accordance with the preferred embodiment, when the pressure in the chamber is decreased to, e.g., 666 Pa (500 Torr) after the rough pumping line starts to exhaust the inside of the chamber, the APC 14 is switched to the OPEN mode, and the main pumping line starts to exhaust the inside of the chamber.

Thus, the main pumping starts to exhaust the inside of the chamber earlier than the conventional case, thereby noticeably enhancing the throughput.

Further, in the conventional atmospheric transfer unit, after the transfer arm 43 is moved down and the number and positions of the wafers W in the wafer cassette 40 are detected by using the extended mapping arm to detect, the elevation unit 49 is moved up along the arm base supporting column. When the elevation unit 49 reaches the upper end of the arm base supporting column 48, the mapping arm 46 is contracted.

However, in the substrate processing method in accordance with the preferred embodiment, the mapping arm 46 is contracted as soon as the elevation unit 49 starts to be moved up along the arm base supporting column 48.

Thus, the elevation of the elevation unit 49 and the contraction of the mapping arm 46 are performed simultaneously, thereby markedly enhancing the throughput.

Figure 16:
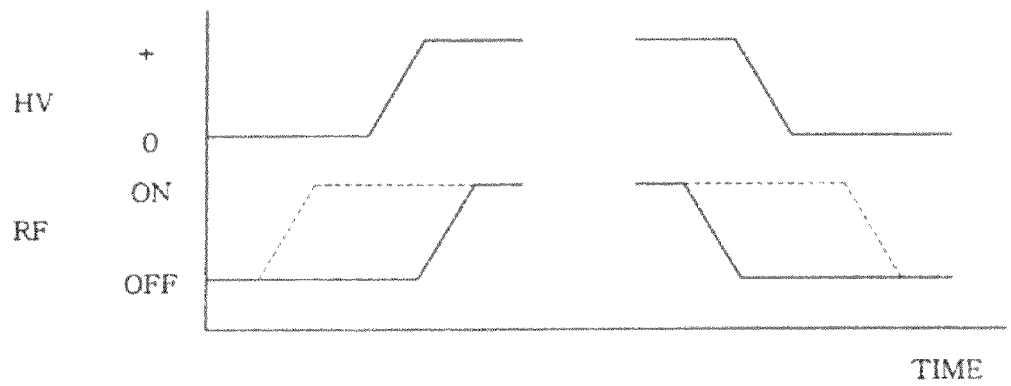
FIG. 16 provides a sequence chart for showing the first example of the substrate processing method in accordance with the preferred embodiment, that is applied to the STEP2 shown in FIG. 4.

FIG. 16 is a sequence chart for showing a first example of the substrate processing method in accordance with the preferred embodiment, that is applied to the STEP2 shown in FIG. 4.

Conventionally, before performing the etching process on the wafer W, the DC power supply is switched from the non-applied voltage mode to the HV reverse applied voltage mode, and then the high frequency power supply is switched from the non-supply mode to the high frequency power supply mode. Further, after performing the etching process on the wafer W, the high frequency power supply is switched from the high frequency power supply mode to the non-supply mode, and then the DC power supply is switched from the HV reverse applied voltage mode to the non-applied voltage mode.

However, in the substrate processing method in accordance with the preferred embodiment, the wafer W is supplied with electric charges by using plasma and thus the electrostatic adsorptive force between the wafer W and susceptor 11 is intensified to thereby reduce a depressurization level of the pressure in the chamber 10 required for electrostatically adsorbing the wafer W onto the susceptor 11 and decrease the time for the HV reverse application. Further, to promote the dechucking of the wafer W, the electric charges on the wafer W are removed by using the plasma. That is, in the substrate processing method in accordance with the preferred embodiment, the high frequency power supply mode of the high frequency power supply 18 is performed for a longer period compared to the conventional substrate processing method.

Specifically, before performing the etching process on the wafer W, the high frequency power supply 18 is switched from the non-supply mode to the high frequency power supply mode, and then the DC power supply 22 is switched from the non-applied voltage mode to the HV reverse applied voltage mode. Further, after performing the etching process on the wafer W, the DC power supply is switched from the HV application mode to the non-applied voltage mode, and then the high frequency power supply is switched from the high frequency power supply mode to the non-supply mode.

Thus, the depressurization level of the pressure in the chamber 10 required for electrostatically adsorbing the wafer W onto the susceptor 11 is reduced, and the dechucking of the wafer W is promoted, thereby greatly enhancing the throughput.

Further, in the heat transfer gas supply unit in the conventional PM, the heat transfer gas supply openings respectively confronting a central portion and a peripheral potion of the rear side of the wafer W mounted on the upper surface of the susceptor are connected to the DP via a distribution pipe having a single valve and another distribution pipe having another valve and an orifice, respectively. The heat transfer gas supply unit has the rear side of the wafer W vacuum pumped by opening the valve in one of the two distribution pipes to make the heat transfer gas supply openings communicate with the DP.

Figure 17:
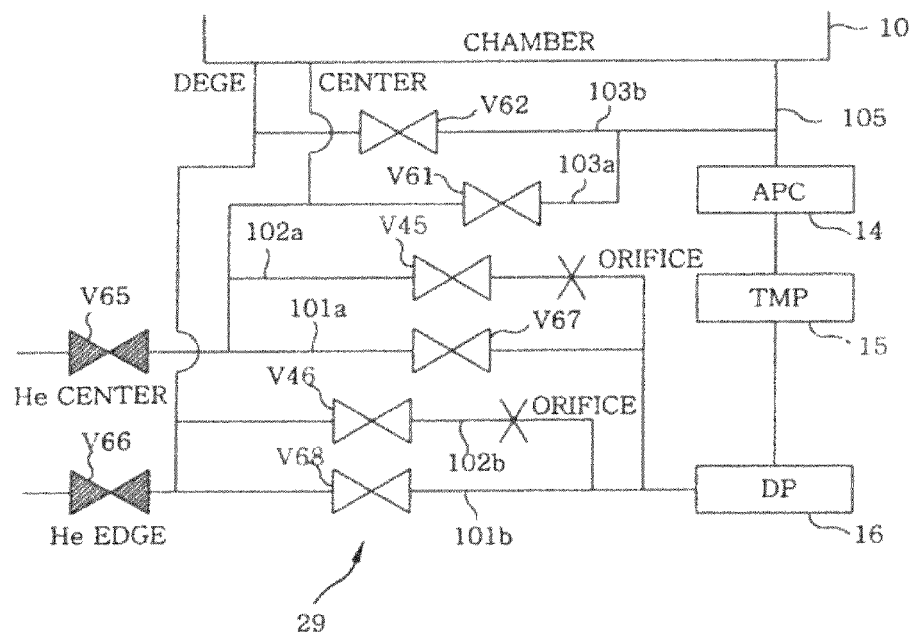
FIG. 17 shows a conceptual configuration of the heat transfer gas supply unit in the substrate processing apparatus shown in FIG. 2.

However, as shown in FIG. 17, in the heat transfer supply unit 29 in the PM 2 in the substrate processing system in accordance with the preferred embodiment, the heat transfer gas supply openings 27 respectively confronting a center portion and a peripheral portion (respectively designated by "CENTER" and "EDGE" in FIG. 17) of the rear side of the wafer W mounted on the upper surface of the susceptor 11 are connected to a PCV (Pressure Control Valve) (not shown) via a valve V65 and a valve V66, respectively.

Further, the heat transfer gas supply openings 27 respectively confronting the center portion and the peripheral portion are connected to the DP 16 via first distribution pipes 101a and 101b having valves V67 and V68 and second distribution pipes 102a and 102b having orifices and valves V45 and V46, respectively, and connected to the distribution pipe 105 between the chamber 10 and the APC 14 via third distribution pipes 103a and 103b, respectively. Therefore, the heat transfer gas supply openings 27 respectively confronting a center portion and a peripheral portion of the rear side of the wafer W are connected to the TMP 15 via the third distribution pipes 103a and 103b and the APC 14.

Thus, the rear side of the wafer W can be vacuum pumped by the TMP 15, and the vacuum pumping of the rear side of the wafer W and the heat transfer gas supply line 28 can be performed quickly, thereby greatly enhancing the throughput.

Figure 18:
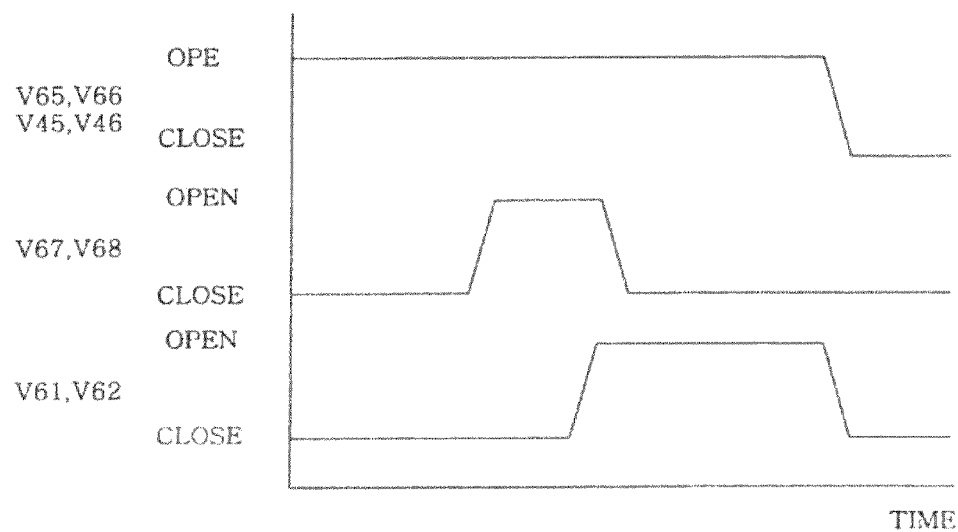
FIG. 18 shows a sequence chart for illustrating a valve control of the heat transfer gas supply unit shown in FIG. 18.

FIG. 18 shows a sequence chart for illustrating a valve control of the heat transfer gas supply unit shown in FIG. 17.

After the etching process is performed on the wafer W at STEP2 shown in FIG. 4, the valves V45, V46, V65 and V66 opened at STEP2 are kept opened. Thus, the He gas is provided to the rear side of the wafer W via the PVC, and a surplus amount of He gas is removed from the heat transfer supply line 28 by using the DP 16.

Thereafter, at the step of vacuum pumping the rear side shown in FIG. 4, firstly the valve V67 and V68 are opened to remove the He gas in the heat transfer gas supply line 28 by using the DP 16. After a specified time has elapsed, the valves V61 and V62 are opened, and then the valves V67 and V68 are closed to remove the He gas in the heat transfer gas supply line 28 by using the TMP 15. Subsequently, the valves V61 and V62 are closed, and then the valves V45, V46, V65 and V66 are also closed.

When the valve V61 and V62 are opened, the end portions of the third distribution pipes 103a and 103b communicate with the inside of the chamber 10, so that, if the pressure of the He gas remaining in the heat transfer gas supply line 28 is high, the remaining He gas may be introduced into the chamber 10 to thereby prevent the inside of the chamber 10 from being lowered. To counter this, in the sequence shown in FIG. 18, the He gas in the heat transfer gas supply line 28 is removed by using the DP 16 before the He gas is removed by using the TMP 15 to lower the pressure of the He gas in the heat transfer gas supply line 28, thereby preventing the He gas from being introduced into the chamber 10 when the valves V61 and V62 are opened.

Figure 19:
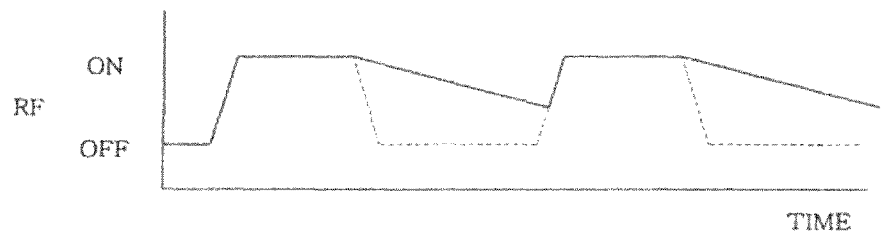
FIG. 19 provides a sequence chart for depicting the second example of the substrate processing method in accordance with the preferred embodiment, that is applied to the STEP2 shown in FIG. 4.

FIG. 19 provides a sequence chart for depicting a second example of the substrate processing method in accordance with the preferred embodiment, being applied to STEP2 shown in FIG. 4.

Conventionally, in case the etching process is performed on the wafer W, the high frequency power supply is repeatedly switched between the high frequency power supply mode and the non-supply mode. However, the substrate processing method in accordance with the preferred embodiment, the high frequency power supply 18 is repeatedly switched between the high frequency power supply mode and a high frequency power reduction mode for steadily reducing the high frequency power supplied to the susceptor.

Thus, during a time interval between an operation of STEP2 and a next repeated operation of the STEP2, a significant amount of the plasma is left on the susceptor 11. Thus, a desired amount of the plasma can be generated more quickly during the next repeated operation of the STEP2, thereby markedly enhancing the throughput.

Figure 20:
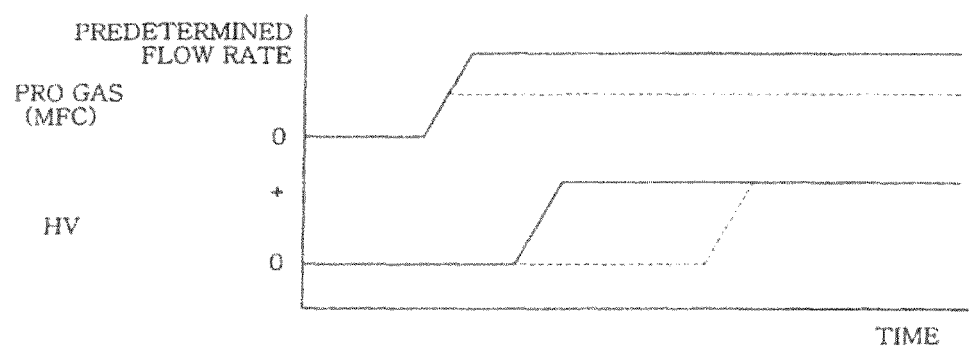
FIG. 20 provides a sequence chart for depicting the first example of the substrate processing method in accordance with the preferred embodiment, that is applied to the STEP1 shown in FIG. 4.

FIG. 20 provides a sequence chart for depicting a first example of the substrate processing method in accordance with the preferred embodiment, which is applied to the STEP 1 shown in FIG. 4.

Conventionally, when electrostatically adsorbing the wafer W, the DC power supply is switched from the non-applied voltage mode to the HV application mode after the MFC is switched from the non-supply mode to the predetermined processing gas flow rate mode. Herein, as the supplying flow rate of the processing gas in the predetermined processing gas flow rate mode, a sufficient amount of the flow rate is set to increase the pressure in the chamber to make it easy to discharge the surplus amount of electric charges charged on the adsorption surface of the susceptor and to adsorb the wafer W onto the susceptor. Further, the DC power supply is switched to the HV application mode to electrostatically adsorb the wafer W when the pressure difference between the upper and the backside of the wafer W becomes sufficient for adsorbing the wafer.

In the substrate processing method in accordance with the preferred embodiment, similarly to the conventional substrate processing method, after the MFC 39 is switched from the non-supply mode to the predetermined processing gas flow rate mode, the DC power supply 22 is switched from the non-applied voltage mode to the HV application mode. However, the supplying flow rate of the processing gas in the predetermined processing gas flow rate mode of the MFC 39 is set to be greater than that of the conventional substrate processing method, e.g., equal to the supplying flow rate of the $N_2$ gas in the maximum supply mode.

Thus, the pressure in the chamber quickly reaches a pressure level at which the surplus amount of the electric charges on the adsorption surface of the susceptor can be discharged, and the DC power supply 22 is switched to the HV application mode earlier, thereby greatly enhancing the throughput.

Figure 21:
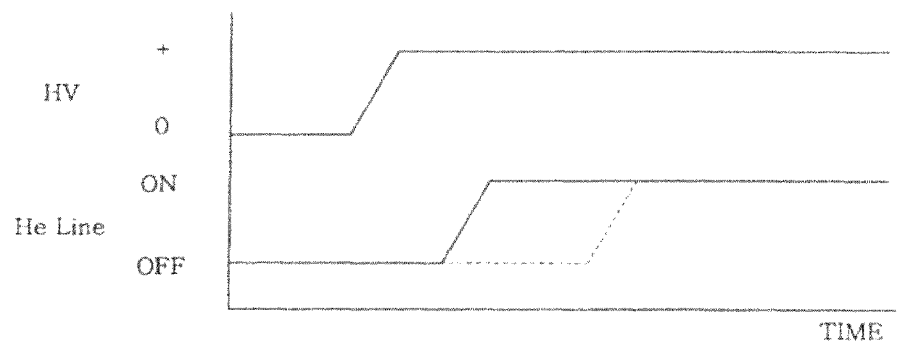
FIG. 21 is a sequence chart for showing the second example of the substrate processing method in accordance with the preferred embodiment, that is applied to the STEP1 shown in FIG. 4.

FIG. 21 is a sequence chart for showing a second example of the substrate processing method in accordance with the preferred embodiment, which is applied to the STEP1 shown in FIG. 4.

Conventionally, in case of supplying the He gas to the backside of the wafer W, when a specified stabilization time, e.g., 2 seconds has elapsed after the DC power supply is switched from the non-applied voltage mode to the HV application mode, the heat transfer gas supply unit supplies the He gas to the backside of the wafer W via the heat transfer supply line. However, in he substrate processing method in accordance with the preferred embodiment, the stabilization time is reduced to, e.g., 0.5 second.

Thus, the He gas is supplied to the backside of the wafer W earlier, thereby greatly enhancing the throughput.

Figure 22:
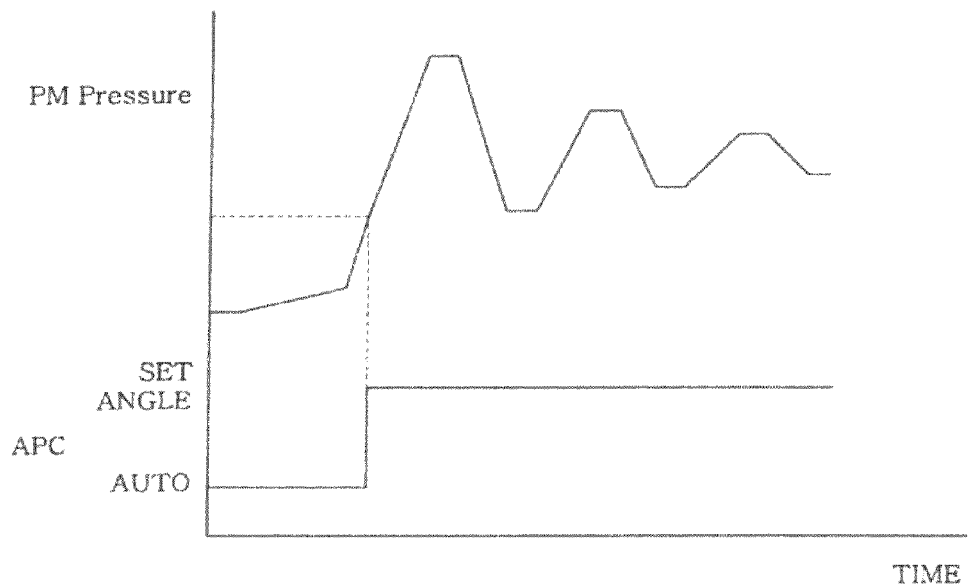
FIG. 22 depicts a sequence chart for representing the second example of the substrate processing method in accordance with the preferred embodiment, that is applied to the step of the vacuum pumping of the backside shown in FIG. 4.

FIG. 22 depicts a sequence chart for representing a second example of the substrate processing method in accordance with the preferred embodiment, which is applied to the step of the vacuum pumping of the backside shown in FIG. 4.

Conventionally, when increasing the pressure in the chamber to the ESC dechucking-pressure, an opening degree (angle) of the variable valve in the APC is adjusted by, e.g., a feedback control to control the pressure in the chamber. Herein, the APC is automatically controlled (AUTO) so that the angle of the variable valve is changed until the pressure in the chamber is stabilized, but the fine adjustment of the angle of the variable valve is difficult to be made. Thus, the pressure in the chamber repeatedly swings between an overshoot state and an undershoot state.

However, in the substrate processing method in accordance with the preferred embodiment, when controlling the pressure in the chamber 10, the APC is automatically controlled so that the angle of the variable valve is changed if the pressure in the chamber 10 is lower than a specified level. Thereafter, if the pressure in the chamber 10 is increased to become higher than the specified level, the automatic control of the APC is cancelled so that the angle of the variable valve becomes fixed (SET ANGLE). Then, the pressure in the chamber 10 is controlled by a supplying amount of the processing gas of the MFC 39.

Thus, if the pressure in the chamber 10 is higher than the specified level, the angle of the variable valve in the APC is fixed, so that the swing between the overshoot and undershoot state of the pressure in the chamber 10 can be avoided and the pressure in the chamber 10 is quickly stabilized at a desired level, thereby greatly enhancing the throughput.

Further, in the conventional PM, when controlling the pressure in the chamber by using the APC or the MFC, a threshold value of pressure change to activate an interlock which is a mode of stopping device operations is set in a manner independent of the chamber pressure control steps shown in FIG. 4. However, in the substrate processing method in accordance with the preferred embodiment, the threshold value of pressure change is set in a manner that it varies depending on the respective steps shown in FIG. 4. Specifically, the threshold value of pressure change is set to be small at the STEP 1 and STEP2, whereas the threshold value of pressure change is set to be large at other steps, wherein a small change in the pressure in the chamber is allowable, such as the steps of taking the wafer into the chamber, vacuum pumping the backside and the wafer dechucking.

Thus, unnecessary activations of the interlocks can be reduced at the steps of taking the wafer into the chamber, vacuum pumping the backside and the wafer dechucking, thereby remarkably enhancing the throughput.

Figure 23:
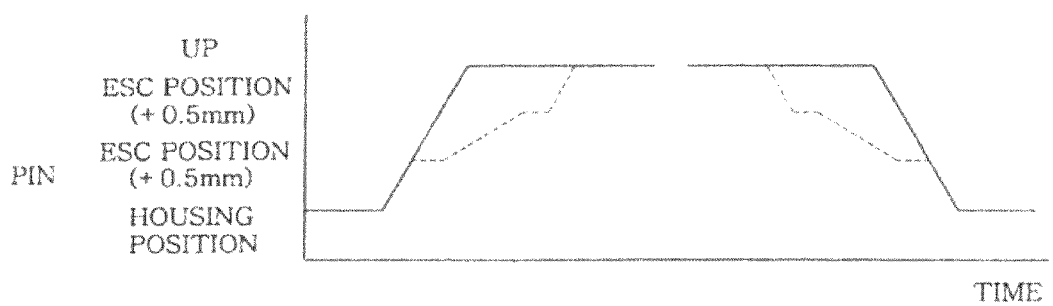
FIG. 23 presents a sequence chart for providing a seventh example of the substrate processing method applied to the step of taking the wafer into the chamber and a third example of the step of taking the wafer out of the chamber shown in FIG. 4 in accordance with the preferred embodiment.

FIG. 23 presents a sequence chart for providing a seventh example of the substrate processing method applied to the step of taking the wafer into the chamber and a third example of the step of taking the wafer out of the chamber shown in FIG. 4 in accordance with the preferred embodiment.

Conventionally, when the pusher pins are protruded, the pusher pins at the accommodated position are firstly moved up to the first waiting position lower than the surface of the susceptor by 0.5 mm, and, after waiting a specified time, the pusher pins are moved up to the second waiting position higher than the surface of the susceptor by 0.5 mm. Then, after waiting another specified time, the pusher pins are moved up to the receiving position. Further, when the pusher pins are moved down, a reverse sequence of the sequence described above is followed.

However, in the substrate processing method in accordance with the preferred embodiment, the waiting positions of the pusher pins 30 are omitted. Specifically, when the pusher pins 30 at the accommodated position start to be protruded, they move directly up to the receiving position. Further, when the pusher pins 30 at the receiving position start to be moved down, they move directly down to the accommodated position.

Thus, the waiting time of the pusher pins 30 during moving up and down can be omitted, thereby remarkably enhancing the throughput.

Conventionally, in a wafer replacement process, since the $N_2$ gas in the chamber in the LL is introduced into the chamber in the PM due to a pressure difference between the chamber in the LL and the chamber in the PM while the gate valve is opened, the APC is maintained at the OPEN mode for the inside of the chamber to be purged except for the time when the dechucking of the susceptor is performed. Therefore, the processing gas cannot be introduced into the chamber by the MFC while the gate valve is opened, so that it is difficult for the pressure in the chamber to quickly reach the process pressure by supplying the processing gas.

However, in the wafer replacement process in accordance with the preferred embodiment, the operations of the $N_2$ gas supply system 52 in the LL 4 and the LL gas exhaust unit 53 are controlled based on the pressure difference between the chamber 51 in the LL 4 and the chamber 10 in the PM 2, and this pressure difference is made to disappear before the gate valve 5 is opened. Thus, the N2 gas in the chamber 51 in the LL 4 is prevented from being introduced into the chamber 10 in the PM 2, so that the pressure in the chamber can be quickly changed to the process chamber by supplying the processing gas.

Figure 24:
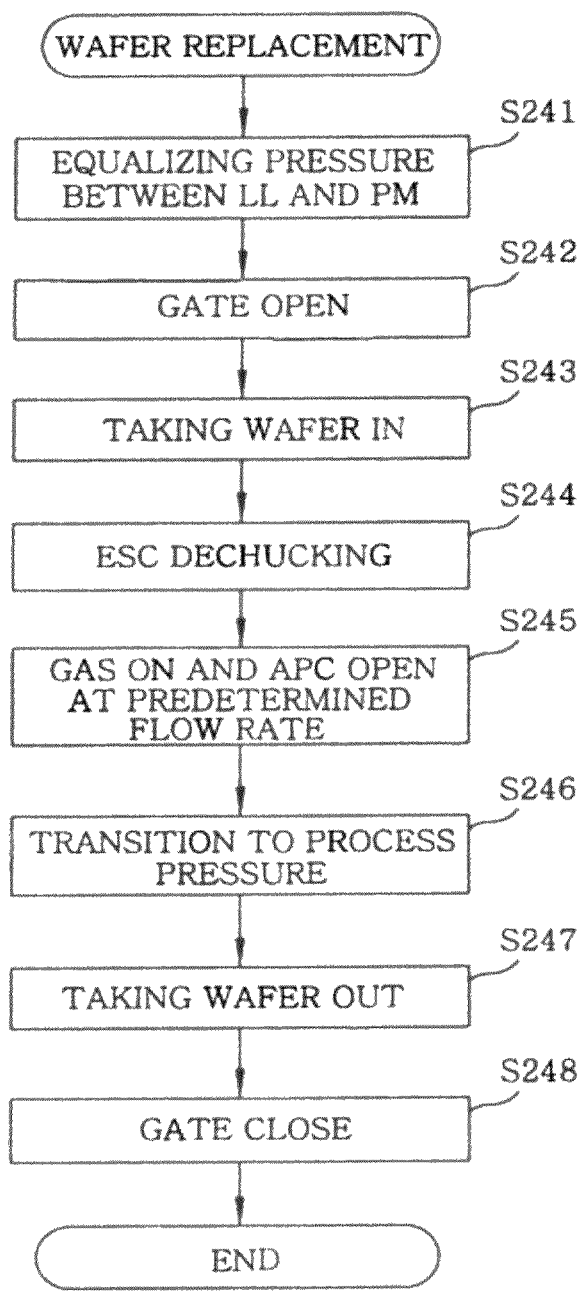
FIG. 24 represents a flow chart of the wafer replacement process in accordance with the preferred embodiment.

FIG. 24 represents a flow chart of the wafer replacement process in accordance with the preferred embodiment.

Referring to FIG. 24, the pressure difference between the chamber 51 in the LL 4 and the chamber 10 in the PM 2 is made to disappear by controlling the operations of the $N_2$ gas supply system 52 and the LL gas exhaust system 53 (step S242), and the transport arm 50 takes the wafer W out of the chamber 10 (step S243).

Thereafter, the APC 14 is switched from the OPEN mode to the ESC dechucking-pressure mode, the MFC 39 is switched from the non-supply mode to the maximum supply mode, and the DC power supply 22 is switched from the non-applied voltage mode to the HV reverse applied voltage mode, thereby performing the dechucking of the susceptor 11, i.e., the ESC dechucking (step S244).

Thereafter, the MFC 39 is switched from the maximum supply mode to the predetermined processing gas flow rate mode, and, at the same time, the APC 14 is switched from the ESC dechucking mode to the OPEN mode (step S245). After a specified time has elapsed, the APC 14 is switched from the OPEN mode to the process pressure mode to thereby make the pressure inside the chamber 10 be set at the process pressure (step S246).

Subsequently, the transport arm 50 takes a next wafer W into the chamber 10 (step S247), and the gate valve 5 is closed (step S248) to complete this process.

In accordance with the process shown in FIG. 24, since the pressure difference between the chamber 51 in the LL 4 and the chamber 10 in the PM 2 is made to disappear before the gate valve 5 is opened, the $N_2$ gas in the chamber 51 in the LL 4 is not introduced into the chamber 10 in the PM 2.

Figure 25:
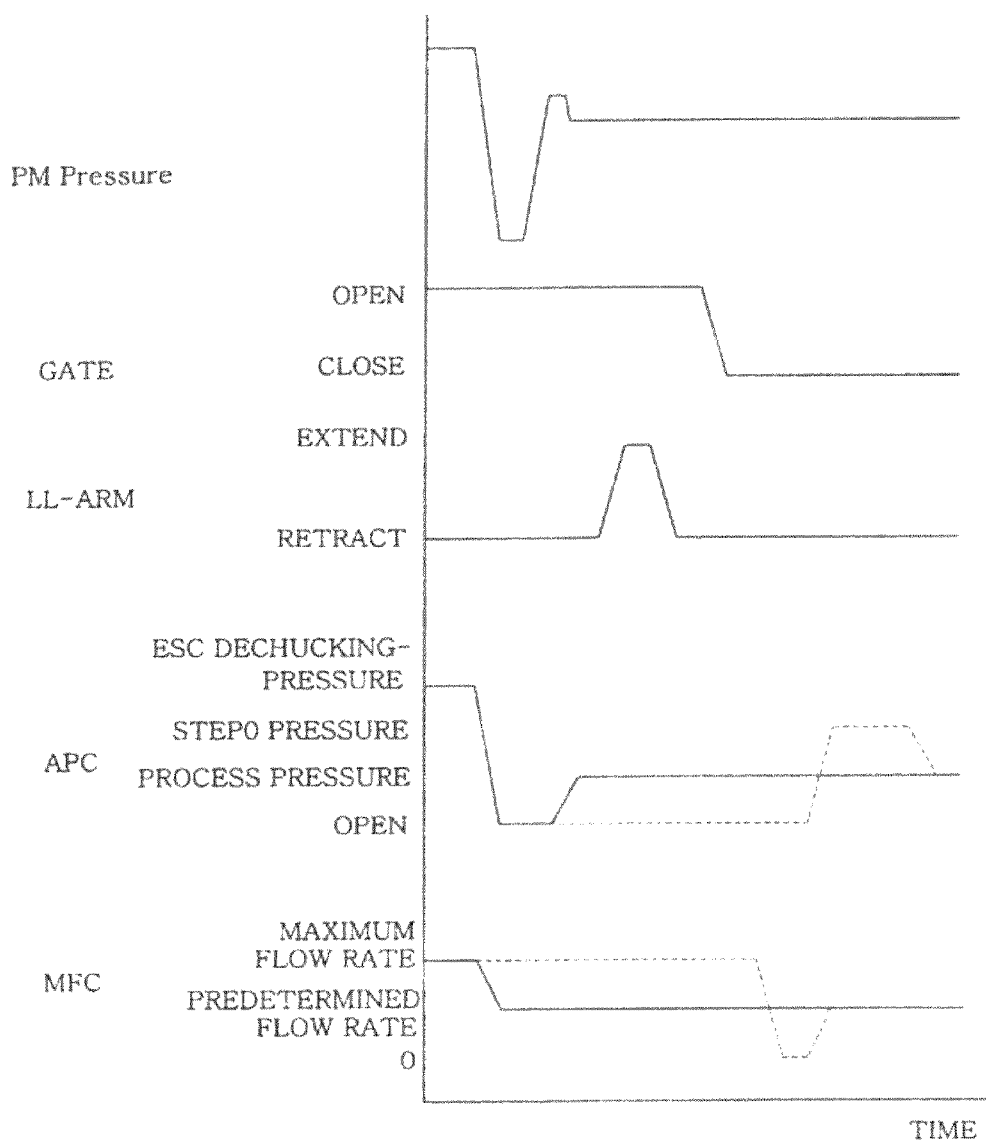
FIG. 25 is a sequence chart of the wafer replacement process shown in FIG. 24.

Conventionally, as illustrated by dotted lines in FIG. 25, even after the ESC dechucking, the APC needs to be maintained in the OPEN mode for a long time to purge the $N_2$ gas introduced into the chamber in the LL, and the MFC needs to be maintained in the maximum supply mode to enhance the efficiency of the purge. However, in accordance with the process shown in FIG. 24, since the $N_2$ gas in the chamber 51 in the LL 4 is not introduced into the chamber 10 in the PM 2, the APC need not be maintained in the OPEN mode for a long time and the MFC need not be maintained in the maximum supply mode after the ESC dechucking. Therefore, in the process shown in FIG. 24, right after the ESC dechucking is performed, the MFC 39 is switched from the maximum supply mode to the predetermined processing gas flow rate mode, and, at the same time, the APC 14 is switched from the ESC dechucking mode to the OPEN mode. Further, the APC 14 is switched to the process pressure mode, so that the pressure inside the chamber 10 quickly becomes settled at the process pressure, as shown in FIG. 25. Thus, the throughput can be enhanced greatly.

In the following, an example of the substrate processing method in accordance with the preferred embodiment in case where the LL 4 in the substrate processing system 1 is connected to the PM 60. Further, in FIGS. 26A to 26C and the drawings thereafter, the operations in the substrate processing method in accordance with the preferred embodiment are represented by solid lines and the operations in the conventional substrate processing method are represented by dotted lines.

FIGS. 26A to 26C present sequence diagrams for illustrating an eighth example of the substrate processing method applied to the step of taking the wafer into the chamber and a fourth example of the step of taking the wafer out of the chamber shown in FIG. 4 in accordance with the preferred embodiment.

Conventionally, when the wafer w is transferred into the chamber, the pusher pins become protruded from the upper surface of the electrostatic chuck on the lower electrode (GAP) at the loading/unloading position to move up to the receiving position for receiving the wafer W. The pusher pins having received the wafer W is moved down to the accommodated position, so that the wafer W is mounted on the electrostatic chuck. The electrostatic chuck on which the wafer W is mounted is moved up to the processing position along with the lower electrode.

Further, when the wafer W is taken out of the chamber, the electrostatic chuck on which the wafer W is mounted is moved down to the loading/unloading position along with the lower electrode. Thereafter, the pusher pins become protruded from the upper surface of the electrostatic chuck to lift the wafer W on the electrostatic chuck to the receiving position.

However, in the substrate processing method in accordance with the preferred embodiment, when the wafer w is transferred into the chamber 61, the pusher pins 80 become protruded from the upper surface of the electrostatic chuck 71 on the lower electrode 62 (GAP) at the loading/unloading position to move up to the receiving position for receiving the wafer W (see FIG. 26A). The pusher pins 80 having received the wafer W are kept at the receiving position for the time being. Thereafter, the electrostatic chuck 71 starts to be moved up along with the lower electrode 62. The electrostatic chuck 71 receives the wafer W from the pusher pins 80 while it is on the rise. Then, the electrostatic chuck 71 is moved up to the processing position (see FIG. 26B).

Further, when the wafer W is taken out of the chamber 61, the electrostatic chuck 71 on which the wafer W is mounted starts to be moved down along with the lower electrode after the etching process is performed on the wafer W. The electrostatic chuck 71 transfers the wafer W to the pusher pins 80 while it is moving down. Then, the electrostatic chuck 71 is moved down to the loading/unloading position (see FIG. 26C). After the pusher pins 80 deliver the wafer W to the transport arm 50, they move down to the accommodated position.

Thus, when the wafer is transferred into the chamber 61, the pusher pins 80 are not moved down from the receiving position to the accommodated position, and further, when the wafer is transferred out of the chamber 61, the pusher pins 80 are not moved up from the accommodated position to the receiving position. Thus, the wafer W can be transferred more quickly, thereby greatly enhancing the throughput.

Figure 27:
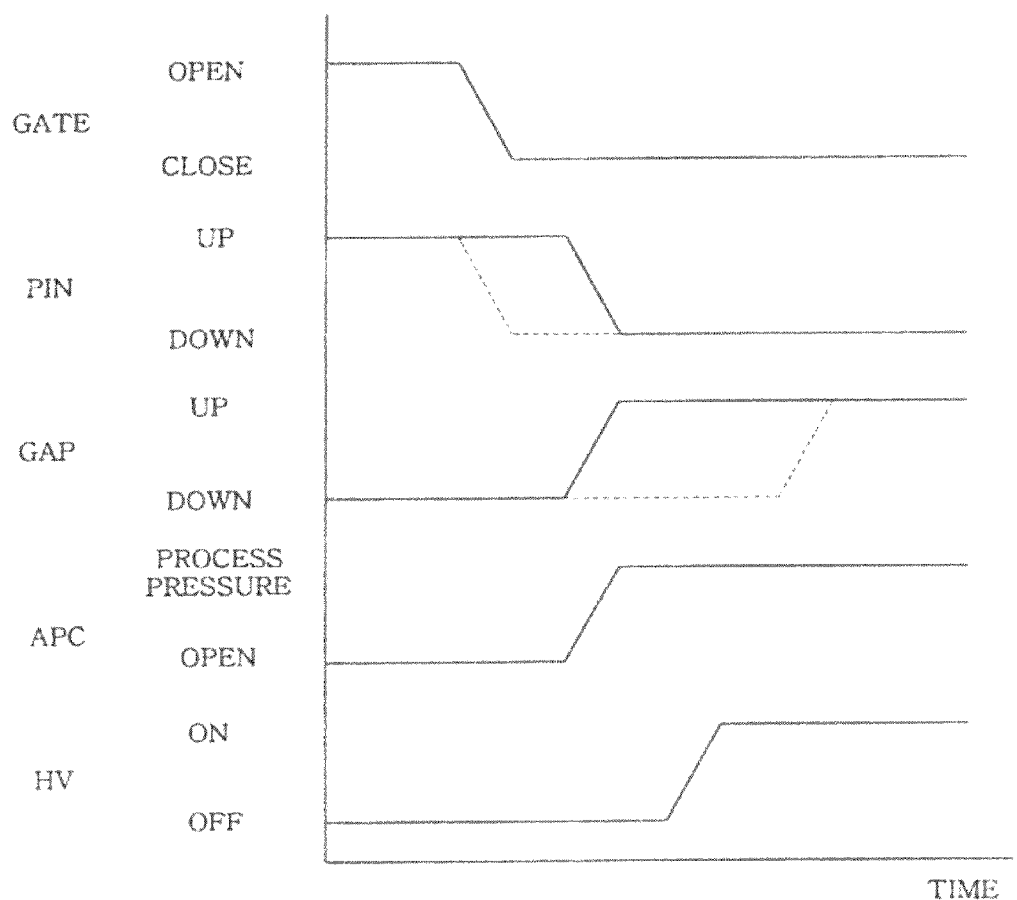
FIG. 27 provides a sequence chart for depicting the third example of the substrate processing method in accordance with the preferred embodiment, that is applied to the STEP1 shown in FIG. 4.

FIG. 27 provides a sequence chart for depicting a third example of the substrate processing method in accordance with the preferred embodiment, that is applied to the STEP 1 shown in FIG. 4.

Conventionally, when the electrostatic chuck is moved up to he processing position along with the lower electrode, firstly the gate valve is closed and, at the same time, the pusher pins are moved down from the receiving position to the accommodated position. Thereafter, the APC is switched from the OPEN mode to the process pressure mode, the DC power supply is switched from the non-applied voltage mode to the HV application mode, and the electrostatic chuck is moved up from the loading/unloading position to the processing position along with the lower electrode.

However, in the substrate processing method in accordance with the preferred embodiment, firstly the gate valve 5 is closed, and then the pusher pins 80 are moved down from the receiving position to the accommodated position, the APC is switched from the OPEN mode to the process pressure mode, and the electrostatic chuck 71 is moved up from the loading/unloading position to the processing position along with the lower electrode 62. Thereafter, the DC power supply 73 is switched from the non-applied voltage mode to the HV application mode.

Thus, the APC is switched from the OPEN mode to the process pressure mode at the same time when the electrostatic chuck 71 is moved up from the loading/unloading position to the processing position, thereby substantially enhancing the throughput.

Figure 28:
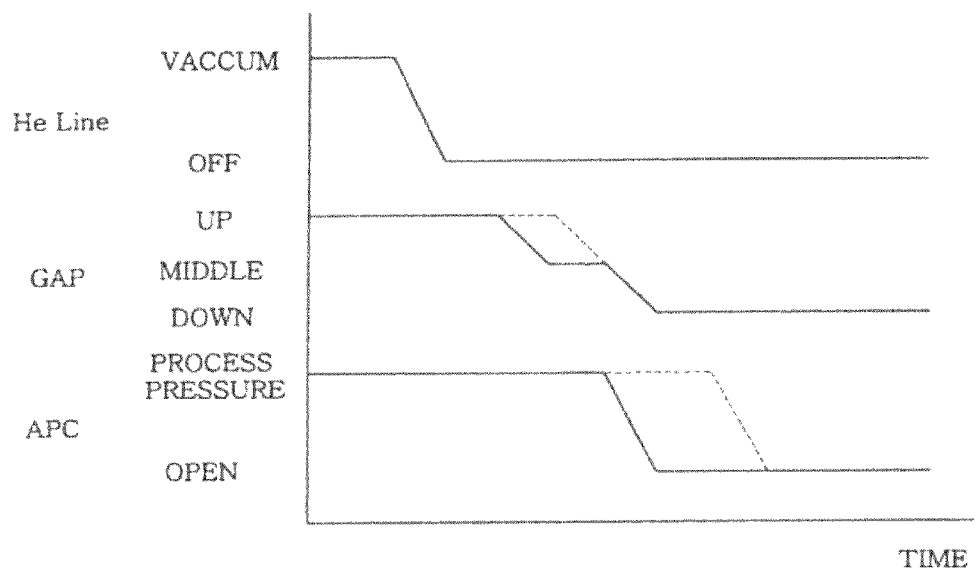
FIG. 28 is a sequence chart for showing the fifth example of the substrate processing method in accordance with the preferred embodiment, that is applied to the step of taking the wafer out of the chamber shown in FIG. 4.

FIG. 28 is a sequence chart for showing a fifth example of the substrate processing method in accordance with the preferred embodiment, that is applied to the step of taking the wafer out of the chamber shown in FIG. 4.

Conventionally, when the wafer W is taken out of the chamber, firstly the heat transfer gas supply unit finishes the vacuum pumping of the heat transfer gas supply line, and then the electrostatic chuck is moved down from the processing position to the loading/unloading position along with the lower electrode. Thereafter, the APC is switched from the process pressure mode to the OPEN mode.

However, in the substrate processing method in accordance with the preferred embodiment, the lower electrode 62 further has a middle position (MIDDLE) between the processing position and the loading/unloading position. Thus, when the wafer W is taken out of the chamber 62, firstly the heat transfer gas supply unit 84 finishes the vacuum pumping of the heat transfer gas supply line 83, and then the electrostatic chuck 71 is moved down from the processing position to the middle position along with the lower electrode 62. Then, after a specified time has elapsed, the electrostatic chuck 71 is moved down from the middle position to the loading/unloading position along with the lower electrode 62. Meanwhile, the APC is switched from the process pressure mode to the OPEN mode.

Thus, the electrostatic chuck 71 is moved down from the middle position to the loading/unloading position at the same time when the APC is switched from the process pressure mode to the OPEN mode, thereby greatly enhancing the throughput.

Figure 29:
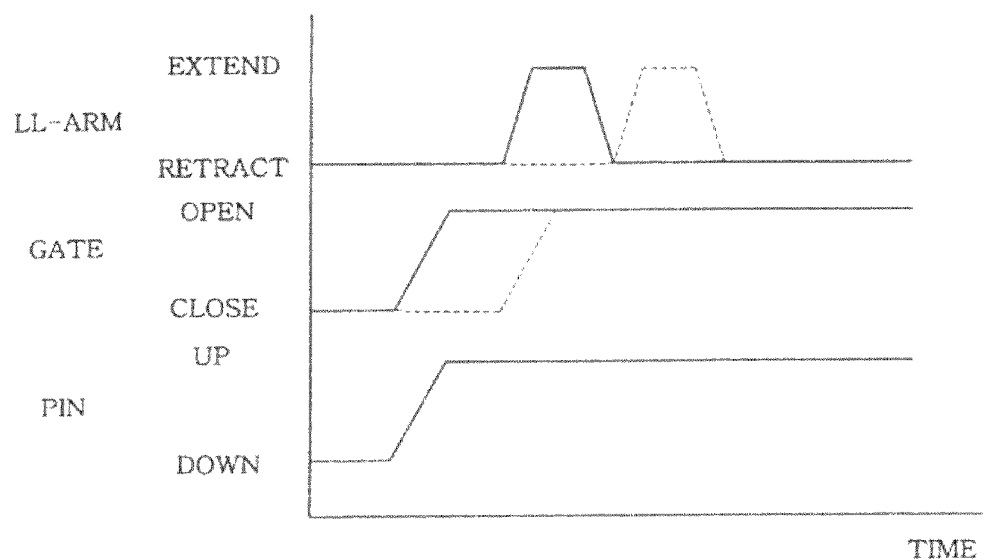
FIG. 29 represents a sequence chart for describing the sixth example of the substrate processing method in accordance with the preferred embodiment, that is applied to the step of taking the wafer out of the chamber shown in FIG. 4.

FIG. 29 represents a sequence chart for describing a sixth example of the substrate processing method in accordance with the preferred embodiment, that is applied to the step of taking the wafer out of the chamber shown in FIG. 4.

Conventionally, when the wafer W is taken out of the chamber, firstly the pusher pins are moved up from the accommodated position to the receiving position to lift the wafer W. Then, after the gate valve is opened, the transport arm enters the chamber to receive the wafer W, and then withdraws from the chamber.

However, in the substrate processing method in accordance with the preferred embodiment, when the wafer W is taken out of the chamber 61, firstly the pusher pins 80 are moved up from the accommodated position to the receiving position to lift the wafer W. Meanwhile, the gate valve 5 is opened. Thereafter, the transport arm 50 enters the chamber 61 to receive the wafer W, and then withdraws from the chamber 61.

Thus, the pusher pins 80 are moved up from the accommodated position to the receiving position at the same time when the gate valve 5 is opened, thereby markedly enhancing the throughput.

Further, the above-described examples may be applied to the substrate processing system 1 individually or as a combination of two or more of them.

Furthermore, a host computer or an external server connected to the substrate processing system 1 monitors a maintenance period of the devices in the substrate processing system 1 such as the PM 2, the atmospheric transfer unit 3 and the LL 4, and, if the devices are in the maintenance period, the host computer or the external server sends a maintenance command to a software in the computer in the substrate processing system 1. The software, having received the maintenance command, determines whether the PM 2, the atmospheric transfer unit 3 or the LL 4 can be moved on to a maintenance state. If the PM 2, the atmospheric transfer unit 3 or the LL 4 is in an idle state so that it can be moved on to the maintenance state, the software performs an atmospheric opening sequence for increasing the pressure in the chamber 10 in the PM 2 or the pressure in the chamber 51 in the LL 4 to an atmospheric level.

Thus, administrators and the like can start a maintenance operation immediately, thereby enhancing the operating rate of the substrate processing system 1.

Further, the object of the invention can also be achieved by providing a memory medium (or a storage medium) storing a program code of a software for implementing the functions of the preferred embodiment to a substrate processing system 1 or the PM 2 so that the control device in the substrate processing system 1 or the PM 2 such as a computer, a CPU or a MPU, or the control device connected to the substrate processing system 1 such as an external server reads out the program code stored in the memory medium to execute it.

Still further, although the functions of the preferred embodiment can be implemented in a manner that the computer or the like reads out to perform the program code as described above, the functions of the preferred embodiment can also be implemented in a manner that an operating system (OS) or the like in the computer or the like performs all or a part of processes for performing the program code in response to a command of the program code, wherein the functions of the preferred embodiment are implemented by the processes for performing the program code.

Furthermore, the functions of the preferred embodiment can also be implemented in a manner that the program code read out from the memory medium is stored in a memory included in a function extension card inserted in the computer or the external server or a function extension unit connected to the external server, and, in response to commands of the program code, a CPU or the like included in the function extension card or the function extension unit performs all or a part of the processes for performing the program code, wherein the functions of the preferred embodiment are implemented by the processes for performing the program code.

In addition, any program code will be satisfactory as long as it makes it possible for the functions of the embodiment to be implemented by the computer or the external server. The form of the program code may be an object code, a program code performed by using an interpreter, script data supplied to an OS, or so forth.

As for the memory medium, any memory medium will be satisfactory as long as it can store the program code, namely, a RAM, a NV-RAM, a floppy disc, a hard disc, an optical disc, a magneto-optical disc, a CD-ROM, a MO, a CD-R, a CD-RW, a DVD (DVD-ROM, DVD-RAM, DVD-RW and DVD+RW), a magnetic tape, a nonvolatile memory card and other kinds of ROM. Otherwise, the program code can be downloaded from other computers, databases or the like (not shown) connected to the Internet, a commercial network or a local area network, the like.

Further, it is also possible to configure an optimal substrate processing sequence in a manner that the host computer or the external server connected to the substrate processing system 1 monitors the operations of the respective devices in the substrate processing system 1 such as the PM 2, the atmospheric transfer unit 3 and the LL 4 or a processing situation of the wafer to extract operations that can be performed simultaneously based on the monitoring result and make a combination of the extracted operations. In this case, the operations of the respective devices of the substrate processing system 1 such as the PM 2, the atmospheric transfer unit 3 and the LL 4 can be controlled by the optimal substrate processing sequence. Thus, the throughput can be enhanced effectively.

Still further, in case the substrate processing system 1 includes a plurality of PMs 2 and a plurality of wafers W are sequentially processed by the plurality of PMs, the host computer or the external server makes a list of a wafer process sequence for defining the sequence of the processes to be performed on the plurality of wafers W, and the substrate processing system 1 processes the respective wafers W based on the list of the wafer process sequence. In addition, when a process on a wafer W listed on the list is performed, the host computer or the external server may monitor the operations of the respective devices in the substrate processing system 1 such as the PM 2, the atmospheric transfer unit 3 and the LL 4 or a processing situation of the wafer and, based on the monitoring result, configure an optimal substrate processing sequence with respect to the wafer W being currently processed or another optimal substrate processing sequence with respect to another wafer W to be processed next according to the list. Thus, the throughput of the wafer W being currently processed as well as the wafer W to be processed next according to the list can be enhanced.

In the preferred embodiment described above, the explanation has been given as to a case where the substrate processing apparatus is an etching processing apparatus. However, the substrate processing apparatus to which the present invention can be applied is not limited thereto and may also be a coating and developing apparatus, a substrate cleaning apparatus or an etching apparatus.

Furthermore, although the explanation has been given as to a case where the substrate to be transferred is a semiconductor wafer in the preferred embodiment described above, the substrate to be transferred is not limited thereto and may also be a glass substrate of, e.g., a LCD (Liquid Crystal Display) or a FPD (Flat Panel Display).

While the invention has been shown and described with respect to the preferred embodiment, it will be understood by those skilled in the art that various changes and modification may be made without departing from the scope of the invention as defined in the following claims.

What is claimed is:

1. A substrate processing system comprising:
   an atmospheric transfer unit for transferring a substrate to be processed;
   an accommodating chamber for accommodating therein the substrate and decreasing a pressure therein;
   a mounting table placed in the accommodating chamber for mounting thereon the substrate;
   a high-frequency power supply for supplying a high-frequency power to the mounting table;
   a heat-transfer gas supply line for supplying a heat-transfer gas to a space between the substrate mounted on the mounting table and the mounting table;
   elevation pins protruded from the mounting table to move up and down the substrate;
   a pressure control unit for controlling a pressure in the accommodating chamber;
   a gas flow rate control and supply unit for controlling a flow rate of a desired gas to supply the desired gas into the accommodating chamber;
   a load-lock chamber, located between the atmospheric transfer unit and accommodating chamber, for loading and unloading the substrate from the atmospheric transfer unit to the accommodating chamber or from the accommodating chamber to the atmospheric transfer unit;
   a gate valve, allowed to be opened and closed, connecting the load-lock chamber and the accommodating chamber; and
   a control unit configured to control a substrate processing method, the method including:
   a first step of transferring the substrate into the accommodating chamber via the atmospheric transfer unit and the load-lock chamber;
   a second step of mounting the substrate on the mounting table and decreasing the pressure in the accommodating chamber;
   a third step of supplying the heat-transfer gas to the space between the substrate and the mounting table;
   a fourth step of etching the substrate;
   a fifth step of stopping, after the fourth step, a heat-transfer gas supply and removing the heat-transfer gas from the space between the substrate and the mounting table by vacuum-pumping;
   a sixth step of removing electrostatic charges on the substrate by bringing the substrate into contact with a plasma; and
   a seventh step of taking out the substrate from the accommodating chamber,
   wherein in at least one of the first to the seventh step, at least one of operations (a) to (g) is performed:
   (a) simultaneously performing a vacuum-pumping operation for vacuum-pumping the heat transfer gas supply line and a transferring operation for transferring the substrate into the accommodating chamber,
   (b) simultaneously performing the transferring operation for transferring the substrate into the accommodating chamber and a pressure-up operation for increasing the pressure in the accommodating chamber by the pressure control unit,
   (c) simultaneously performing an application stopping operation for stopping an application of the high-frequency power by the high-frequency power supply, a gas supply stopping operation for stopping a supply of the desired gas by the gas flow rate control and supply unit, and the vacuum-pumping operation for vacuum-pumping the heat transfer gas supply line,
   (d) simultaneously performing a pin protruding operation for protruding the elevation pins, a pressure-down operation for decreasing the pressure in the accommodating chamber by the pressure control unit, and the gas supply stopping operation for stopping the supply of the desired gas by the gas flow rate control and supply unit,
   (e) simultaneously performing the pressure-up operation for increasing the pressure in the accommodating chamber by the pressure control unit and a mounting table elevating operation for moving up the mounting table,
   (f) simultaneously performing the pressure-down operation for decreasing the pressure in the accommodating chamber by the pressure control unit and a mounting table moving-down operation for moving down the mounting table, and
   (g) simultaneously performing the pin protruding operation for protruding the elevation pins and a closing operation for closing the gate valve.

2. A non-transitory storage medium including computer executable instructions, wherein the instructions, when executed by a processor, cause the processor to perform a substrate processing method for processing a substrate by using a substrate processing system,
   wherein the substrate processing system includes:
   an atmospheric transfer unit for transferring the substrate from a wafer cassette;
   an accommodating chamber for accommodating therein the substrate and decreasing a pressure therein;
   a mounting table placed in the accommodating chamber for mounting thereon the substrate;
   a high-frequency power supply for supplying a high-frequency power to the mounting table;
   a heat-transfer gas supply line for supplying a heat-transfer gas to a space between the substrate mounted on the mounting table and the mounting table;
   elevation pins protruded from the mounting table to move up and down the substrate;
   a pressure control unit for controlling a pressure in the accommodating chamber, and a gas flow rate control and supply unit for controlling a flow rate of a desired gas to supply the desired gas into the accommodating chamber;
   a load-lock chamber, located between the atmospheric transfer unit and the accommodating chamber, for loading and unloading the substrate from the atmospheric transfer unit to the substrate processing device or from the substrate processing device to the atmospheric transfer unit;

a gate valve, allowed to be opened and closed, connecting the load-lock chamber and the accommodating chamber; and the substrate processing method comprising:

a first step of transferring the substrate into the accommodating chamber via the atmospheric transfer unit and the load-lock chamber;

a second step of mounting the substrate on the mounting table and decreasing the pressure in the accommodating chamber;

a third step of supplying the heat-transfer gas to the space between the substrate and the mounting table;

a fourth step of etching the substrate;

a fifth step of stopping, after the fourth step, a heat-transfer gas supply and removing the heat-transfer gas from the space between the substrate and the mounting table by vacuum-pumping;

a sixth step of removing electrostatic charges on the substrate by bringing the substrate into contact with a plasma; and a seventh step of taking out the substrate from the accommodating chamber, wherein in at least one of the first to the seventh step, at least one of operations (a) to (g) is performed:

(a) simultaneously performing a vacuum-pumping operation for vacuum-pumping the heat transfer gas supply line and a transferring operation for transferring the substrate into the accommodating chamber, (b) simultaneously performing the transferring operation for transferring the substrate into the accommodating chamber and a pressure-up operation for increasing the pressure in the accommodating chamber by the pressure control unit, (c) simultaneously performing an application stopping operation for stopping an application of the high-frequency power by the high-frequency power supply, a gas supply stopping operation for stopping a supply of the desired gas by the gas flow rate control and supply unit, and the vacuum-pumping operation for vacuum-pumping the heat transfer gas supply line, (d) simultaneously performing a pin protruding operation for protruding the elevation pins, a pressure-down operation for decreasing the pressure in the accommodating chamber by the pressure control unit, and the gas supply stopping operation for stopping the supply of the desired gas by the gas flow rate control and supply unit, (e) simultaneously performing the pressure-up operation for increasing the pressure in the accommodating chamber by the pressure control unit and a mounting table elevating operation for moving up the mounting table, (f) simultaneously performing the pressure-down operation for decreasing the pressure in the accommodating chamber by the pressure control unit and a mounting table moving-down operation for moving down the mounting table, and (g) simultaneously performing the pin protruding operation for protruding the elevation pins and a closing operation for closing the gate valve.

* * * * *